US012805047B2

(12) United States Patent
Huang et al.

(10) Patent No.: US 12,805,047 B2
(45) Date of Patent: Nov. 17, 2026

(54) IMAGE SENSOR HAVING A LATERAL PHOTODETECTOR STRUCTURE

(71) Applicant: Taiwan Semiconductor Manufacturing Company, Ltd., Hsinchu (TW)

(72) Inventors: Kuo-Chin Huang, Yilan City (TW); Tzu-Jui Wang, Fengshan City (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 986 days.

(21) Appl. No.: 17/857,382

(22) Filed: Jul. 5, 2022

(65) Prior Publication Data

US 2024/0014244 A1 Jan. 11, 2024

(51) Int. Cl.
*H10F 39/00* (2025.01)

(52) U.S. Cl.
CPC ......... *H10F 39/811* (2025.01); *H10F 39/024* (2025.01)

(58) Field of Classification Search
CPC ............................. H10F 39/811; H10F 39/024
See application file for complete search history.

(56) References Cited

U.S. PATENT DOCUMENTS

2007/0210395 A1* 9/2007 Maruyama ............ H10F 39/024 257/431
2015/0270306 A1* 9/2015 Haddad ................. H10F 39/014 257/432
2016/0218138 A1* 7/2016 Oishi .................... H10F 39/014
2016/0343751 A1 11/2016 Sze et al.
2016/0351604 A1* 12/2016 Kalnitsky ............. H10F 39/014
2017/0141153 A1* 5/2017 Lee ...................... H10F 39/1847
2018/0040651 A1* 2/2018 Lee ....................... H10F 39/014
2018/0247969 A1* 8/2018 Mori ...................... H04N 25/46
2018/0308884 A1* 10/2018 Goto ..................... H10F 39/182
2019/0131478 A1 5/2019 Wang et al.
2020/0212083 A1* 7/2020 Cheng ................... H10F 39/199
2021/0159257 A1* 5/2021 Moussy ................ H10F 30/225
2021/0175452 A1* 6/2021 Takahashi .............. H10K 19/20
2021/0193712 A1* 6/2021 Huang .................. H10F 39/014
2021/0210532 A1* 7/2021 Hung .................... H10F 39/014
2021/0273008 A1* 9/2021 Fukuoka ................ H04N 25/76

* cited by examiner

*Primary Examiner* — Marlon T Fletcher
*Assistant Examiner* — Sesha Sairaman Srinivasan
(74) *Attorney, Agent, or Firm* — Eschweiler & Potashnik, LLC

(57) ABSTRACT

The present disclosure relates to an image sensor including a first semiconductor layer having a first doping type. A second semiconductor layer having the first doping type is between sidewalls of the first semiconductor layer and extends vertically along the sidewalls of the first semiconductor layer from a bottom side of the first semiconductor layer toward a top side of the first semiconductor layer. A first doped region having the first doping type is in the first semiconductor layer and laterally beside the second semiconductor layer. The first doped region extends vertically along a sidewall of the second semiconductor layer. A second doped region having a second doping type is in the first semiconductor layer and laterally beside the first doped region. The second doped region extends vertically along a side of the first doped region and forms a p-n junction with the first doped region.

20 Claims, 15 Drawing Sheets

IMAGE SENSOR HAVING A LATERAL PHOTODETECTOR STRUCTURE

BACKGROUND

Integrated circuits (ICs) with complementary metal-oxide-semiconductor (CMOS) image sensors are used in a wide range of modern-day electronic devices, such as, for example, cameras and cell phones. Some CMOS image sensors are based on avalanche photodiodes (APD) and single-photon avalanche photodiodes (SPAD). Some types of CMOS image sensors include front-side illuminated (FSI) image sensors and back-side illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
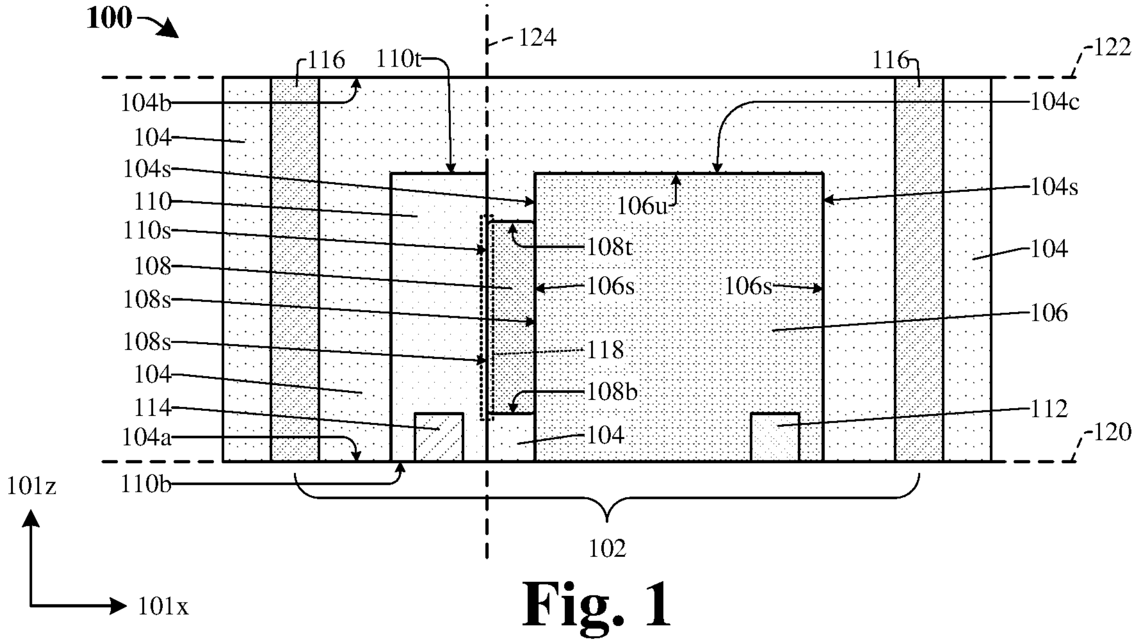
FIG. 1 illustrates a cross-sectional view of some embodiments of an image sensor including a first semiconductor layer, a second semiconductor layer, a first doped region in a first semiconductor layer and laterally beside the second semiconductor layer, and a second doped region in the first semiconductor layer and laterally beside the first doped region.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some modern integrated chips include image sensors. For example, an image sensor includes a photodetector (e.g., a photodiode, an avalanche photodiode (APD), a single-photon avalanche diode (SPAD) or the like) in a substrate. The photodetector includes a first doped region in the substrate and a second doped region in the substrate. The first doped region has a first doping type (e.g., p-type) and the second doped region has a second doping type (e.g., n-type), different from the first doping type. In some image sensors, the first doped region is disposed along a frontside of the substrate and the second doped region is disposed directly over (or directly under) the first doped region. The first doped region and the second doped region meet at a p-n junction that extends in a lateral (e.g., horizontal) direction along the first and second doped regions. For example, the p-n junction extends laterally along the top of the first doped region and the bottom of the second doped region.

Many image sensors include a plurality of individual pixels along the substrate. As technology advances, the lateral distance between the pixels of the image sensor (e.g., pitch) is reduced. A challenge with some photodetectors is that because the p-n junction extends laterally along the first and second doped regions, reducing the lateral distance between pixels of the image sensor requires reducing the size of the p-n junction. Further, reducing the size of the p-n junction may reduce a performance of the photodetector.

Various embodiments of the present disclosure are related to an image sensor including a first doped region and a second doped region laterally beside the first doped region so that a p-n junction between the first and second doped regions extends in a vertical direction. For example, the first doped region and the second doped region are in a first semiconductor layer having a first doping type. A second semiconductor layer having the first doping type is between sidewalls of the first semiconductor layer and extends vertically from a bottom side of the first semiconductor layer toward a top side of the first semiconductor layer. The first doped region has the first doping type and is laterally beside the second semiconductor layer. The second doped region has a second doping type, different than the first doping type, and is laterally beside the first doped region. The first and second doped regions form a p-n junction. By disposing the second doped region laterally beside the first doped region (e.g., instead of vertically over or under the first doped region), the p-n junction extends in a vertical direction (e.g., instead of a lateral or horizontal direction). Because the p-n junction extends in the vertical direction, the width of the pixel can be reduced without reducing the size of the p-n junction. Thus, the lateral distance between pixels of the image sensor can be reduced without diminishing a performance of the image sensor.

FIG. 1 illustrates a cross-sectional view 100 of some embodiments of an image sensor including a first semiconductor layer 104, a second semiconductor layer 106, a first doped region 108 in a first semiconductor layer 104 and laterally beside the second semiconductor layer 106, and a second doped region 110 in the first semiconductor layer 104 and laterally beside the first doped region 108.

The image sensor includes a pixel 102 along the first semiconductor layer 104. The first semiconductor layer 104 has a first side 104*a* (e.g., a frontside) and a second side 104*b* (e.g., a backside), opposite the first side 104*a*. The first side 104*a* and the second side 104*b* extend laterally (e.g., along a horizontal direction 101*x*). The first side 104*a* is in a first plane 120 (e.g., that extends in horizontal direction 101*x*) and the second side 104*b* is in a second plane 122 (e.g., that extends in horizontal direction 101*x*). The first semiconductor layer 104 has a pair of sidewalls 104*s* and a lower surface 104*c* that extends between the pair of sidewalls 104*s*. The first semiconductor layer 104 comprises a first semiconductor (e.g., silicon or some other suitable material). The first semiconductor layer 104 has a first doping type (e.g., p-type doping).

The second semiconductor layer 106 is directly between the sidewalls 104*s* and directly below the lower surface 104*c* of the first semiconductor layer 104. The second semiconductor layer 106 extends vertically (e.g., along a vertical direction 101*z*) along the sidewalls 104*s* of the first semiconductor layer 104 from the first side 104*a* of the first semiconductor layer 104 toward the second side 104*b* of the first semiconductor layer 104. The second semiconductor layer 106 has an upper surface 106*u* that extends laterally along the lower surface 104*c* of the first semiconductor layer 104. The second semiconductor layer 106 has a pair of sidewalls 106*s* that extend vertically along the sidewalls 104*s* of the first semiconductor layer 104. The second semiconductor layer 106 comprises a second semiconductor (e.g., germanium, gallium nitride, gallium arsenide, some other group III-V semiconductor, or some other suitable material), different than the first semiconductor. The second semiconductor layer 106 has the first doping type.

The first doped region 108 in the first semiconductor layer 104 is laterally beside the second semiconductor layer 106. The first doped region 108 extends vertically along the second semiconductor layer 106. For example, a side 108*s* of the first doped region 108 extends vertically along a sidewall 106*s* of the second semiconductor layer 106. A bottom 108*b* of the first doped region 108 is spaced apart from the first side 104*a* of the first semiconductor layer 104. The first doped region 108 has the first doping type.

The second doped region 110 in the first semiconductor layer 104 is laterally beside the first doped region 108. The second doped region 110 extends vertically along the first doped region 108 from the first side 104*a* of the first semiconductor layer 104 toward the second side 104*b* of the first semiconductor layer 104. For example, a side 110*s* of the second doped region 110 extends vertically along a side 108*s* of the first doped region 108. The second doped region 110 has a second doping type (e.g., n-type doping), different from the first doping type.

The first doped region 108 and the second doped region 110 form a photodetector (e.g., a single-photon avalanche diode or the like) in the first semiconductor layer 104. For example, the first doped region 108 and the second doped region 110 form a p-n junction 118 where the first doped region 108 and the second doped region 110 meet. By disposing the first doped region 108 and the second doped region 110 laterally beside one another in the first semiconductor layer 104, the p-n junction 118 extends in a vertical direction (e.g., vertical direction 101*z*) between the first and second doped regions 108, 110. For example, the p-n junction 118 extends in a third plane 124 (e.g., that extends in extends in vertical direction 101*z*) that intersects the first plane 120 and the second plane 122. Further, because the p-n junction 118 extends vertically, a lateral width of the pixel 102 can be reduced without reducing the size of the p-n junction 118. Thus, a lateral distance between the pixel 102 and neighboring pixels of the image sensor can be reduced without diminishing a performance of the image sensor.

In some embodiments, the second semiconductor layer 106 further forms the photodetector and increases the photosensitive area of the pixel 102. For example, by including the second semiconductor layer 106 in the image sensor and laterally beside the first doped region 108, a depletion region of the photodetector can be increased. As a result, the photosensitive area of the pixel 102 can be increased. Thus, a fill factor of the pixel 102 (e.g., a ratio of the photosensitive area of the pixel 102 to the total area of the pixel 102) can be improved. Further, in some embodiments, the second semiconductor layer is lightly doped (e.g., has a low dopant concentration) and comprises a semiconductor material having a small bandgap so that the second semiconductor layer 106 is highly sensitive at some wavelengths (e.g., short-wave infrared (SWIR) or the like). Thus, a sensitivity of the image sensor at such wavelengths can be improved.

In some embodiments, a first contact region 112 is in the second semiconductor layer 106 and a second contact region 114 is in the second doped region 110. The first and second contact regions 112, 114 are disposed along the first side 104*a* of the first semiconductor layer 104. The first contact region 112 is a heavily doped region having the first doping type and the second contact region 114 is a heavily doped region having the second doping type.

In some embodiments, a trench isolation structure 116 extends through the first semiconductor layer 104 and surrounds the pixel 102 along the perimeter of the pixel 102 in a ring shape. The trench isolation structure 116 extends between the first side 104*a* and the second side 104*b* of the first semiconductor layer 104. The trench isolation structure 116 electrically and/or optically isolates the pixel 102 from neighboring pixels (not labeled).

In some embodiments, the first semiconductor layer 104 is on the upper surface 106*u* of the second semiconductor layer 106 and on tops of the first and second doped regions 108, 110. In some embodiments, the first doped region 108 is directly between the second semiconductor layer 106 and the second doped region 110. Further, in some embodiments, the first semiconductor layer 104 is directly between the second semiconductor layer 106 and the second doped region 110 along a bottom of the first doped region 108 and along a top of the first doped region 108. In some embodiments, the third plane 124 is perpendicular to the first plane 120 and the second plane 122. In some embodiments, the first side 104*a* of the first semiconductor layer 104 may be referred to as the bottom side or the bottom surface of the first semiconductor layer 104 and the second side 104*b* of the first semiconductor layer 104 may be referred to as the top side or the top surface of the first semiconductor layer 104.

In some embodiments, a width (e.g., a distance between outer sides) of the second doped region 110 is greater than a width of the first doped region 108 (e.g., as measured along horizontal direction 101*x*). Further, a width of the second semiconductor layer 106 is greater than the width of the second doped region 110. In some embodiments, increasing the width of the second semiconductor layer 106 increases the sensitivity of the photodetector at some wavelengths (e.g., short-wave infrared (SWIR) or the like).

In some embodiments, a top of the second semiconductor layer 106 is above a top 108*t* of the first doped region 108 and a bottom of the second semiconductor layer 106 is below a bottom 108*b* of the first doped region 108. In some embodiments, a top 110*t* of the second doped region 110 is above the top 108*t* of the first doped region 108 and a bottom 110*b* of the second doped region 110 is below the bottom 108*b* of the first doped region 108.

In some embodiments, a dopant concentration of the second semiconductor layer 106 is less than a dopant concentration of the first doped region 108 and a dopant concentration the first semiconductor layer 104. In some embodiments, a dopant concentration of the first contact region 112 is greater than a dopant concentration of the first semiconductor layer 104, the second semiconductor layer 106, and the first doped region 108. In some embodiments, a dopant concentration of the second contact region 114 is greater than a dopant concentration of the second doped region 110.

Figure 2:
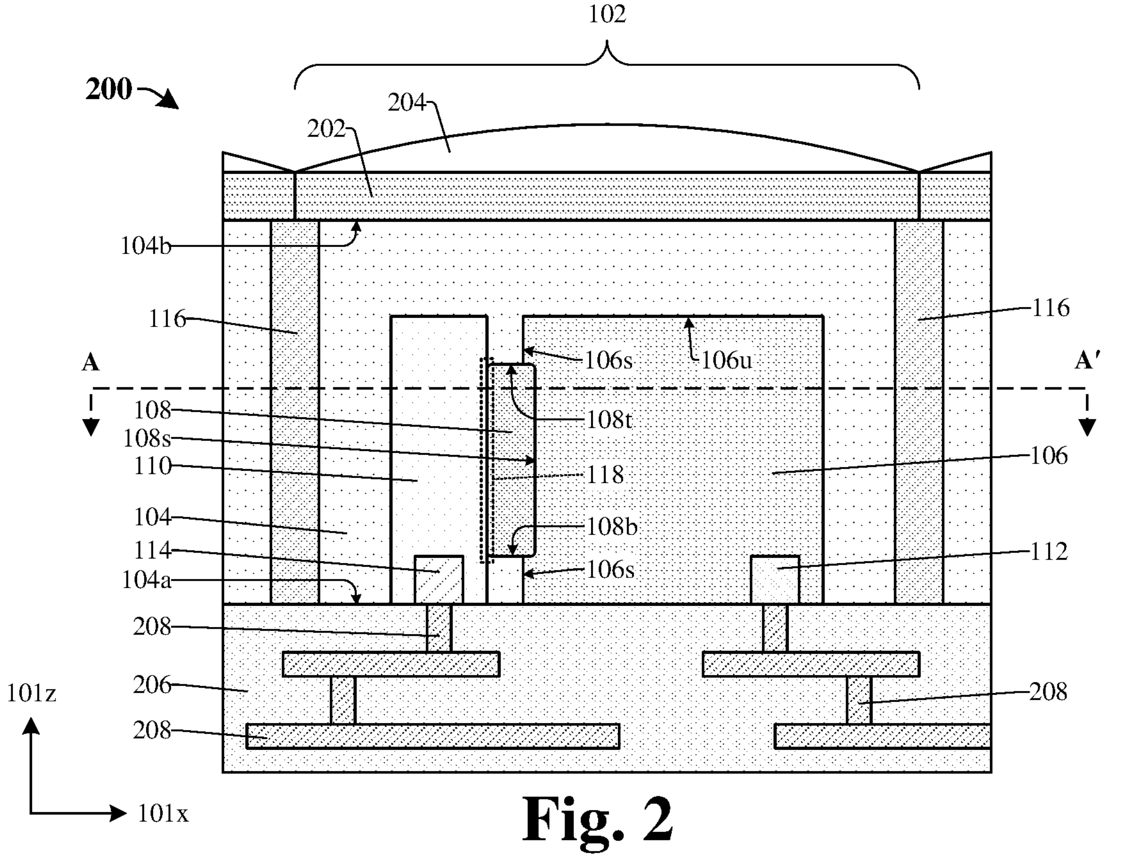
FIG. 2 illustrates a cross-sectional view of some embodiments of the image sensor of FIG. 1 further including a color filter and a micro-lens.

FIG. 2 illustrates a cross-sectional view 200 of some embodiments of the image sensor of FIG. 1 further including a color filter 202 and a micro-lens 204.

The color filter 202 is directly over the first semiconductor layer 104 and the micro-lens 204 is directly over the color filter 202. Photons may enter the pixel 102 through the micro-lens 204 and the color filter 202 before they impinge on the photodetector. In some embodiments, the image sensor further includes a dielectric structure 206 directly below the first semiconductor layer 104 (e.g., on the first side 104*a* of the first semiconductor layer 104) and a plurality of conductive interconnects 208 disposed within the dielectric structure 206.

In some embodiments, the color filter 202 and micro-lens 204 are disposed along the second side 104*b* (e.g., backside) of the first semiconductor layer 104. In such embodiments, the image sensor may be referred to as a backside illuminated (BSI) image sensor. In some other embodiments (not shown), the color filter 202 and micro-lens 204 are alternatively disposed along the first side 104*a* (e.g., frontside) of the first semiconductor layer 104 and over the dielectric structure 206. In such embodiments, the image sensor may be referred to as a frontside illuminated (FSI) image sensor.

In some embodiments, the first doped region 108 laterally extends into the second semiconductor layer 106. For example, the first doped region 108 may diffuse into the second semiconductor layer 106, thereby causing the overlap between the first doped region 108 and the second semiconductor layer 106. The overlapping area may be referred to as a diffused region of the first doped region 108. In such embodiments, the second semiconductor layer 106 is directly over the top of the first doped region 108. For example, an upper surface 106*u* and a sidewall 106*s* of the second semiconductor layer 106 are directly over a top 108*t* of the first doped region 108, and the sidewall 106*s* of the second semiconductor layer 106 is directly below a bottom 108*b* of the first doped region 108.

Figure 3:
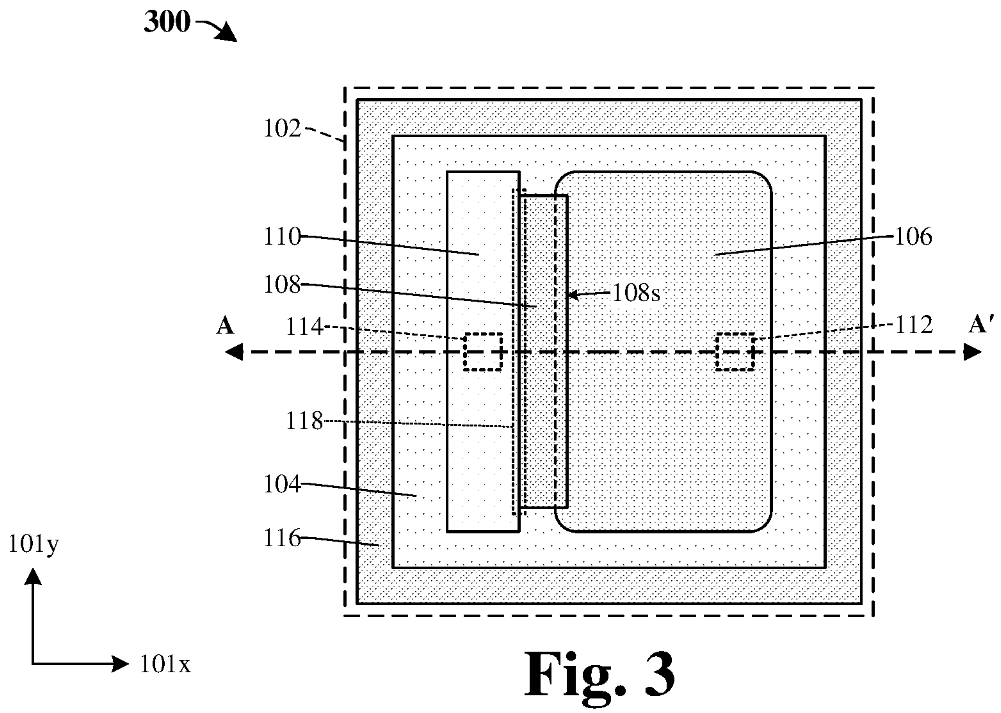
FIGS. 3-5 illustrate top views of some embodiments of the image sensor of FIG. 2.

FIG. 3 illustrates a top view 300 of some embodiments of the image sensor of FIG. 2. In some embodiments, the top view 300 of FIG. 3 may, for example, be taken across line A-A' of FIG. 2 and the cross-sectional view 200 of FIG. 2 may, for example, be taken across line A-A' of FIG. 3.

The first doped region 108, the second doped region 110, and the second semiconductor layer 106 extend laterally in horizontal direction 101*x* and horizontal direction 101*y*. In some embodiments, the first doped region 108, the second doped region 110, and the second semiconductor layer 106 have rectangular shaped top views. In some embodiments, the first semiconductor layer 104 has a square shaped top view and the trench isolation structure 116 has a square ring shaped top view. In some other embodiments (not shown), the first semiconductor layer 104 may alternatively have a circular shaped top view and the trench isolation structure 116 may alternatively have a circular ring shaped top view.

Figure 4:
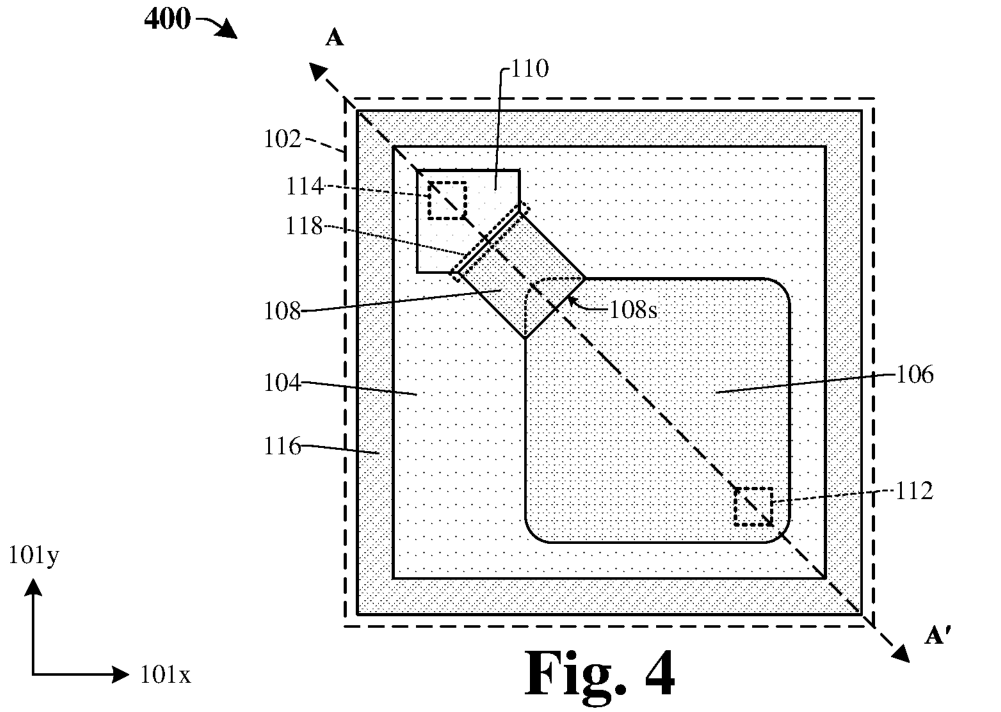
Figure 5:
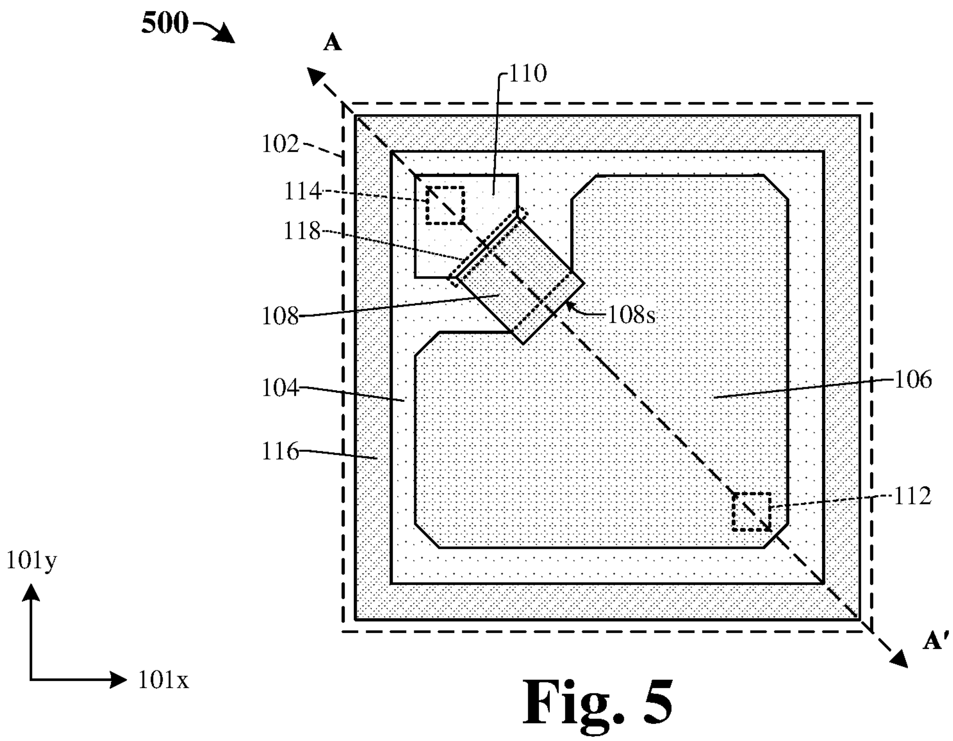

FIG. 4 and FIG. 5 illustrate top views 400, 500 of some other embodiments of the image sensor of FIG. 2. In some embodiments, the top view 400 of FIG. 4 may, for example, be taken across line A-A' of FIG. 2 and/or the cross-sectional view 200 of FIG. 2 may, for example, be taken across line A-A' of FIG. 4. In some embodiments, the top view 500 of FIG. 5 may, for example, be taken across line A-A' of FIG. 2 and/or the cross-sectional view 200 of FIG. 2 may, for example, be taken across line A-A' of FIG. 5.

In some embodiments, the second semiconductor layer 106, the first doped region 108, and the second doped region 110 are arranged along a diagonal of the pixel 102 so that the second semiconductor layer 106 is arranged along a first corner of the pixel 102 and the second doped region 110 is arranged along a second corner of the pixel 102, opposite the first corner.

In some embodiments (e.g., as shown in FIG. 4), the second semiconductor layer 106 has a square shaped top view. In some other embodiments (e.g., as shown in FIG. 5), the second semiconductor layer 106 has an L-shaped top view. In some embodiments, the L-shape of the second semiconductor layer 106 can allow for the area (e.g., when viewed from above) of the second semiconductor layer 106 to be increased. Thus, in such embodiments, a photosensitive area of the pixel 102 may be increased and hence the fill factor of the pixel 102 may be improved.

Figure 6:
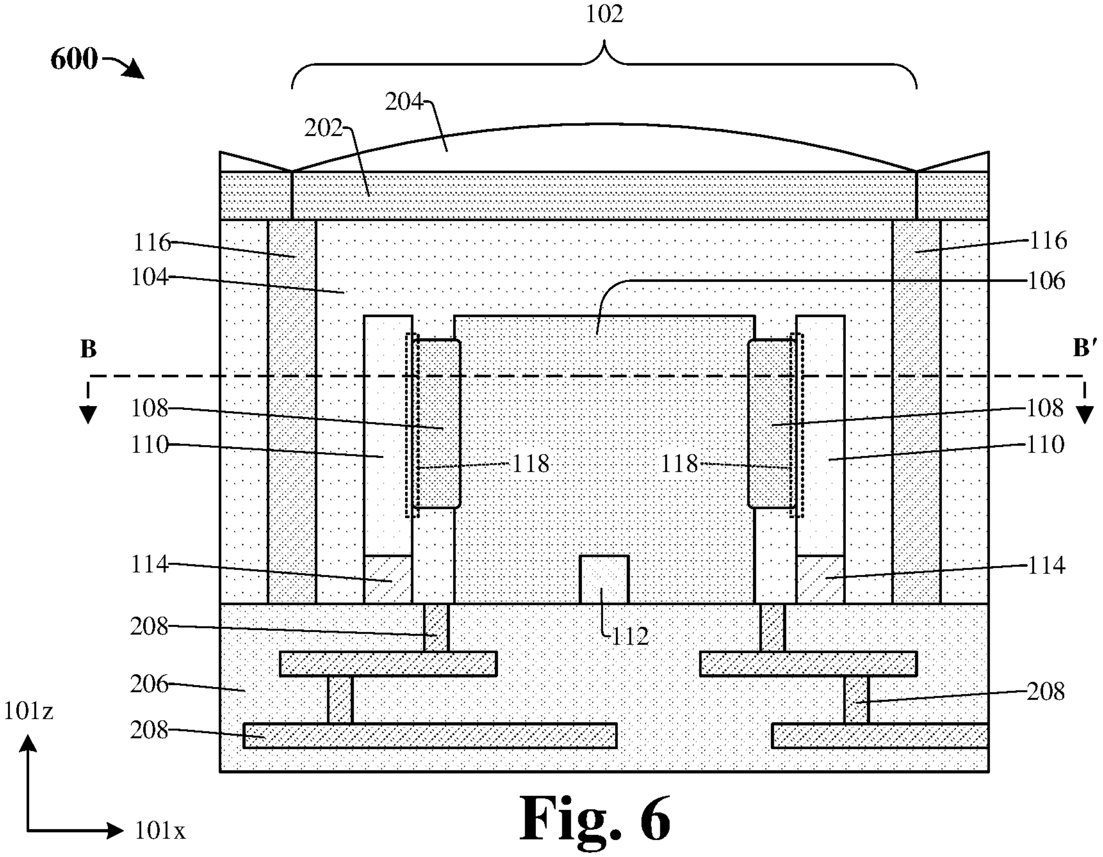
FIG. 6 illustrates a cross-sectional view of some embodiments of the image sensor of FIG. 2 in which the second doped region surrounds the first doped region, and the first doped region surrounds the second semiconductor layer.
Figure 7:
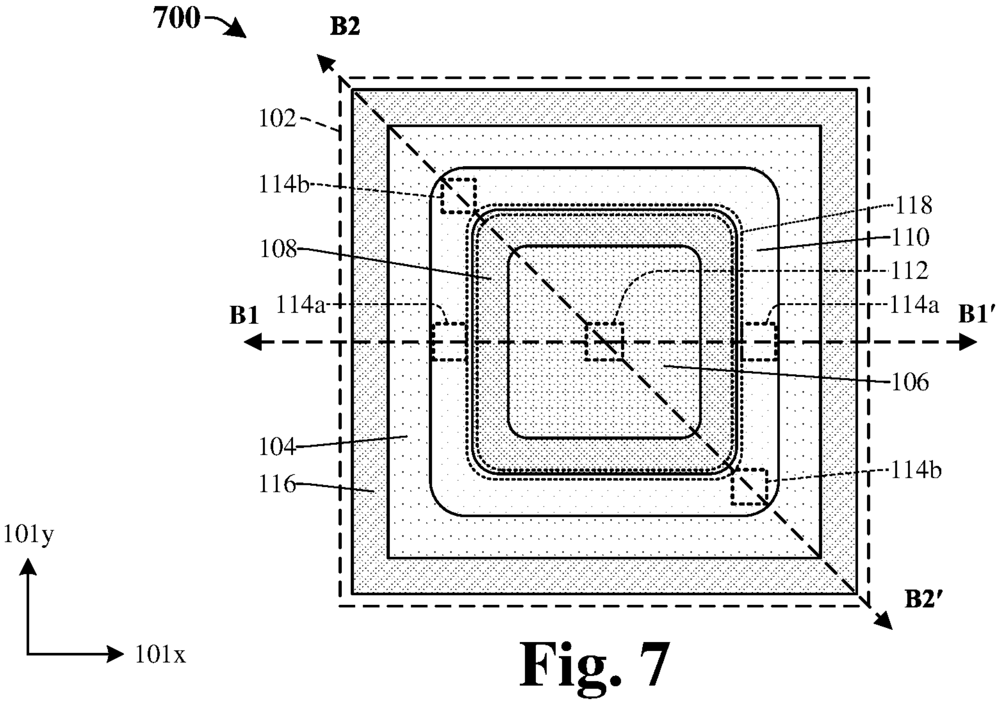
FIG. 7 illustrates a top view of some embodiments of the image sensor of FIG. 6.

FIG. 6 illustrates a cross-sectional view 600 of some embodiments of the image sensor of FIG. 2 in which the second doped region 110 surrounds the first doped region 108, and the first doped region 108 surrounds the second semiconductor layer 106. FIG. 7 illustrates a top view 700 of some embodiments of the image sensor of FIG. 6. In some embodiments, the top view 700 of FIG. 7 may, for example, be taken across line B-B' of FIG. 6 and/or the cross-sectional view 600 of FIG. 6 may, for example, be taken across line B1-B1' or line B2-B2' of FIG. 7.

The second semiconductor layer 106 is in a center of the pixel 102. The first doped region 108 is ring shaped and laterally surrounds the second semiconductor layer 106 in a first closed path. When viewed in cross-sectional (e.g., as shown FIG. 6), a first portion of the first doped region 108 is on a first sidewall of the second semiconductor layer 106 and a second portion of the first doped region 108 is on a second sidewall of the second semiconductor layer 106. Further, the second doped region 110 is ring shaped and laterally surrounds the first doped region 108 in a second closed path. When viewed in cross-sectional (e.g., as shown FIG. 6), a first portion of the second doped region 110 is on a first side of the first doped region 108 and a second portion of the second doped region 110 is on a second side of the first doped region 108. In some embodiments, the first doped region 108 and the second doped region 110 may have square ring shapes (e.g., as illustrated in FIG. 7), circular ring shapes, or some other suitable ring shapes.

In some embodiments, the second contact region 114 is directly below the second doped region 110 and sides of the second contact region 114 are approximately aligned with sides of the second doped region 110. In some embodiments, the second contact region 114 is laterally spaced apart from the second semiconductor layer 106 by the first semiconductor layer 104.

In some embodiments, the first and second contact regions 112, 114 are disposed along sides of the pixel, as illustrated by dashed boxes 112*a*, 114*a*. In some other embodiments, the first and second contact regions 112, 114 are disposed along corners of the pixel 102, as illustrated by dashed boxes 112*b*, 114*b*.

Figure 8:
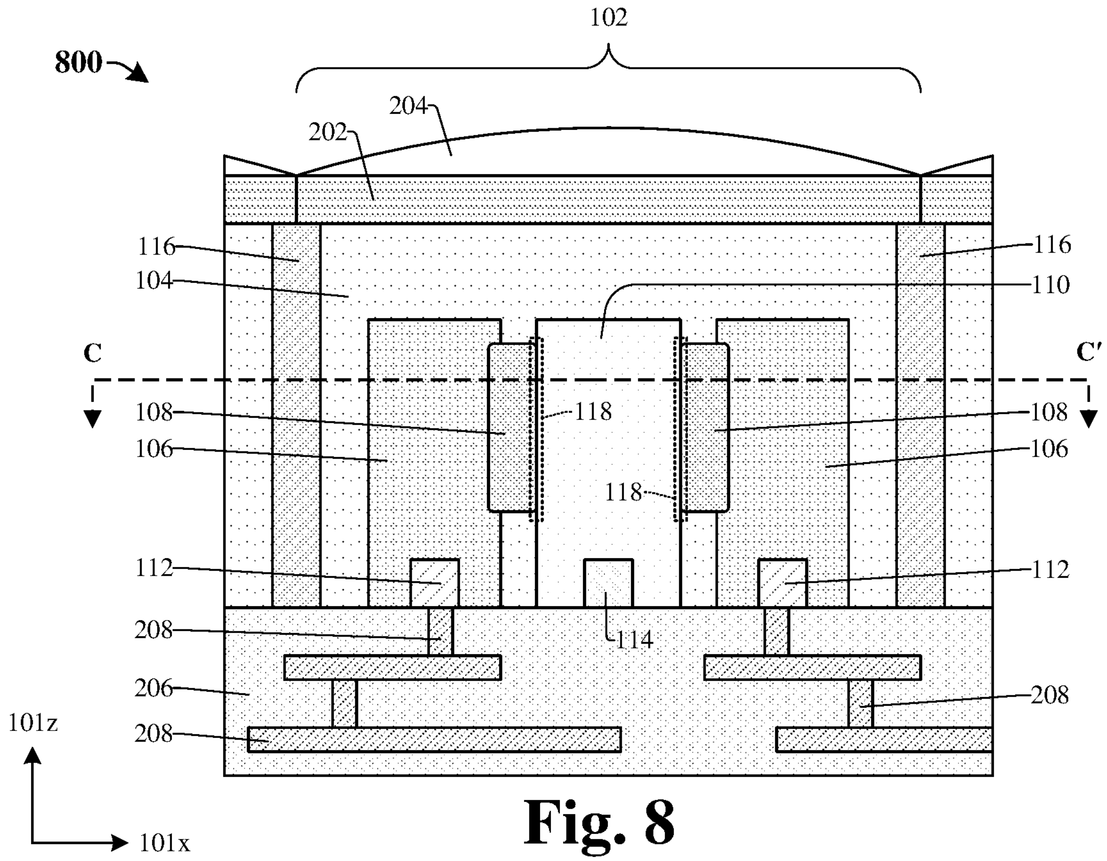
FIG. 8 illustrates a cross-sectional view of some embodiments of the image sensor of FIG. 2 in which the second semiconductor layer surrounds the first doped region, and the first doped region surrounds the second doped region.
Figure 9:
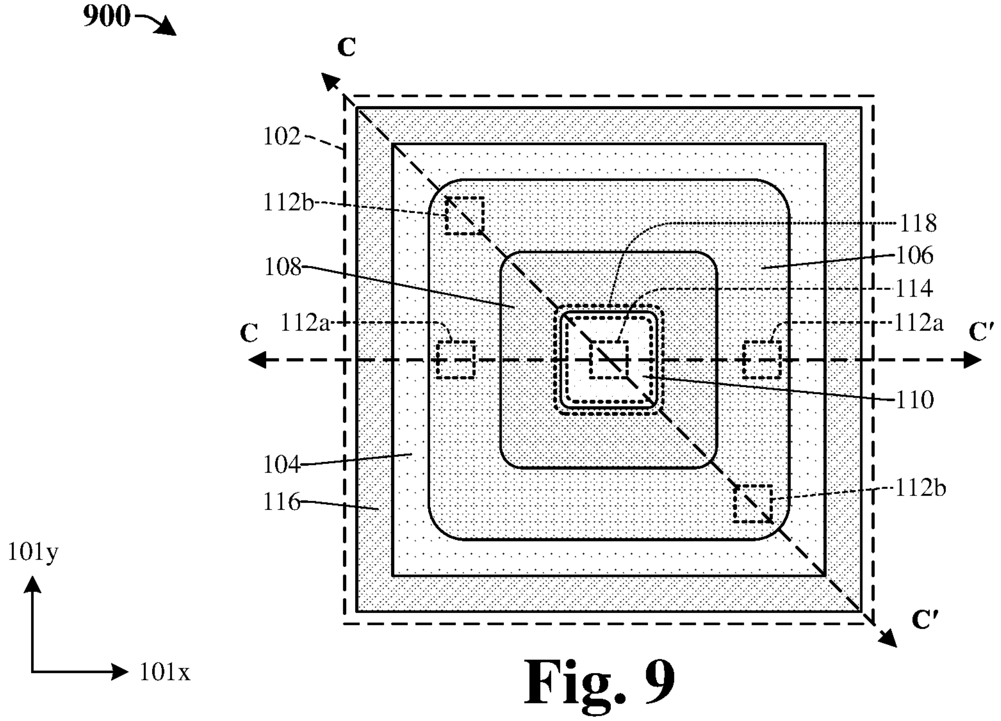
FIG. 9 illustrates a top view of some embodiments of the image sensor of FIG. 8.

FIG. 8 illustrates a cross-sectional view 800 of some embodiments of the image sensor of FIG. 2 in which the second semiconductor layer 106 surrounds the first doped region 108, and the first doped region 108 surrounds the second doped region 110. FIG. 9 illustrates a top view 900 of some embodiments of the image sensor of FIG. 8. In some embodiments, the top view 900 of FIG. 9 may, for example, be taken across line C-C' of FIG. 8 and/or the cross-sectional view 800 of FIG. 8 may, for example, be taken across line C1-C1' or line C2-C2' of FIG. 9.

The second doped region 110 is in a center of the pixel 102. The first doped region 108 laterally surrounds the second doped region 110 in a ring shape. When viewed in cross-sectional (e.g., as shown FIG. 6), a first portion of the first doped region 108 is on a first side of the second doped region 110 and a second portion of the first doped region 108 is on a second side of the second doped region 110. Further, the second semiconductor layer 106 laterally surrounds the first doped region 108 in a ring shape. When viewed in cross-sectional (e.g., as shown FIG. 6), a first portion of the second semiconductor layer 106 is on a first of the first doped region 108 and a second portion of the second semiconductor layer 106 is on a second side of the first doped region 108.

Figure 10:
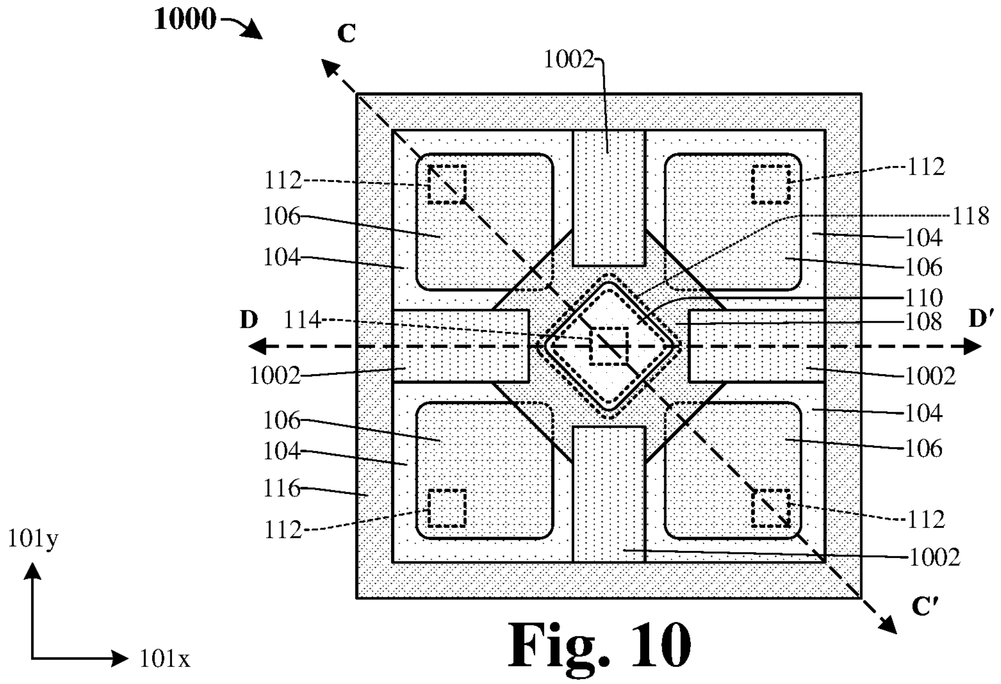
FIG. 10 illustrates a top view of some embodiments of an image sensor of comprising a plurality of separate second semiconductor layers.

FIG. 10 illustrates a top view 1000 of some embodiments of an image sensor of comprising a plurality of separate second semiconductor layers 106. In some embodiments, top view 1000 of FIG. 10 may, for example, be taken across line C-C' of FIG. 8 and/or cross-sectional view 800 may, for example, be taken across line C-C' of FIG. 10.

The separate second semiconductor layers 106 each surround and border the first doped region 108. The first doped region 108 surrounds the second doped region 110. The separate second semiconductor layers 106 are separated from one another by isolation regions 1002. In some embodiments, the isolation regions 1002 extend laterally between the second semiconductor layers 106 from the trench isolation structure 116 toward the second doped region 110. In some embodiments, the isolation regions 1002 are doped regions of the first semiconductor layer 104 and electrically isolate the separate second semiconductor layers 106 from one another along lateral directions 101*x*, 101*y*.

Figure 11:
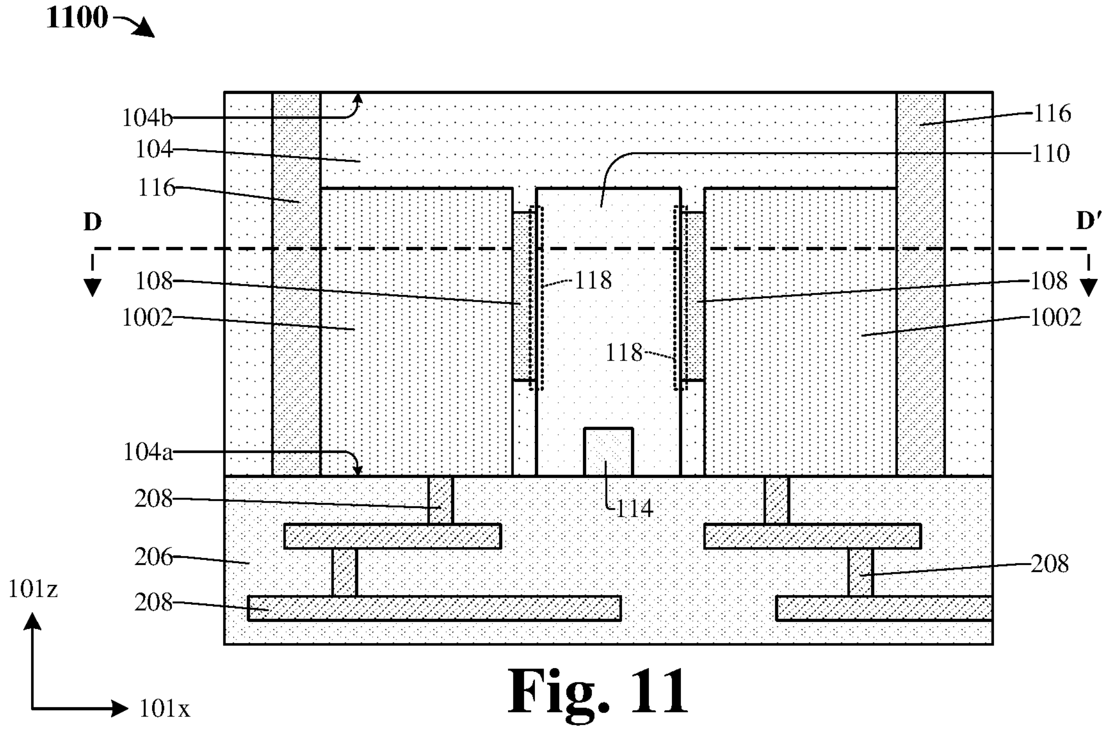
FIG. 11 illustrates a cross-sectional view of some embodiments of the image sensor of FIG. 10.

FIG. 11 illustrates a cross-sectional view 1100 of some embodiments of the image sensor of FIG. 10. In some embodiments, cross-sectional view 1100 of FIG. 11 may, for example, be taken across line D-D' of FIG. 10.

The isolation regions 1002 are on opposite sides of the second doped region 110. In some embodiments, the isolation regions 1002 are directly between the second doped region 110 and the trench isolation structure 116. In some embodiments, the first doped region 108 extends directly between the isolation regions 1002 and the second doped region 110. In some embodiments, the isolation regions 1002 extend vertically through the first semiconductor layer from the first side 104*a* of the first semiconductor layer 104 towards the second side of the first semiconductor layer 104. In some embodiments, the first semiconductor layer 104 is on tops of the isolation regions 1002. In some other embodiments, the isolation regions 1002 extend through the first semiconductor layer 104 to the second side 104*b* of the first semiconductor layer 104 (e.g., similar to the trench isolation structure 116).

Figure 12:
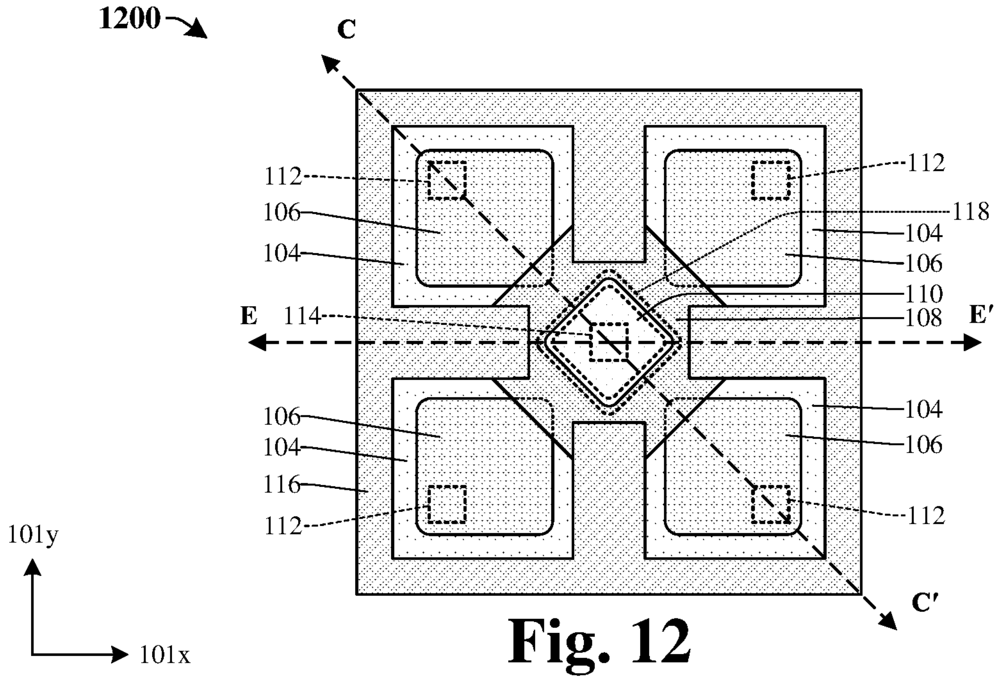
FIG. 12 illustrates a top view of some embodiments of the image sensor of FIG. 10 in which a trench isolation structure separates the separate second semiconductor layers from one another.
Figure 13:
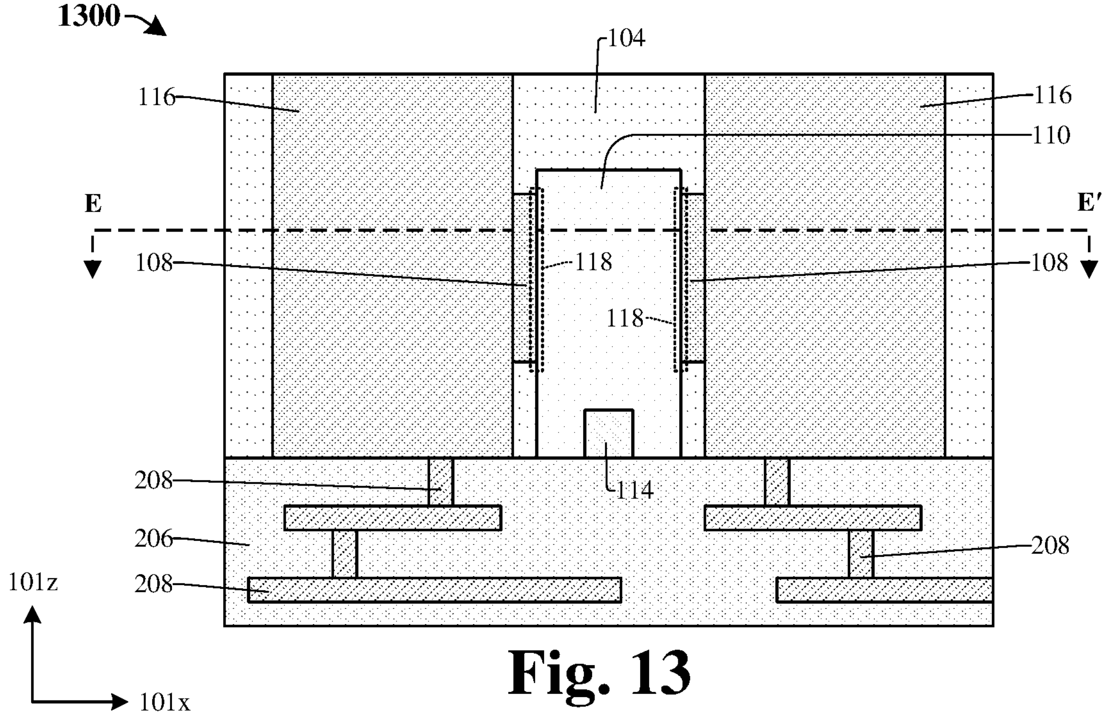
FIG. 13 illustrates a cross-sectional view of some embodiments of the image sensor of FIG. 12.

FIG. 12 illustrates a top view 1200 of some embodiments of the image sensor of FIG. 10 in which the trench isolation structure 116 separates the separate second semiconductor layers 106 from one another. In some embodiments, top view 1200 of FIG. 12 may, for example, be taken across line C-C' of FIG. 8 and/or cross-sectional view 800 may, for example, be taken across line C-C' of FIG. 12. FIG. 13 illustrates a cross-sectional view 1300 of some embodiments of the image sensor of FIG. 12. In some embodiments, cross-sectional view 1300 of FIG. 13 may, for example, be taken across line E-E' of FIG. 12.

For example, in some embodiments, instead of the isolation regions 1002 separating the separate second semiconductor layers 106, the trench isolation structure 116 alternatively extends between the separate second semiconductor layers 106. In some embodiments, the first doped region 108 extends along the trench isolation structure 116 and is directly between the trench isolation structure 116 and the second doped region 110.

Figure 14:
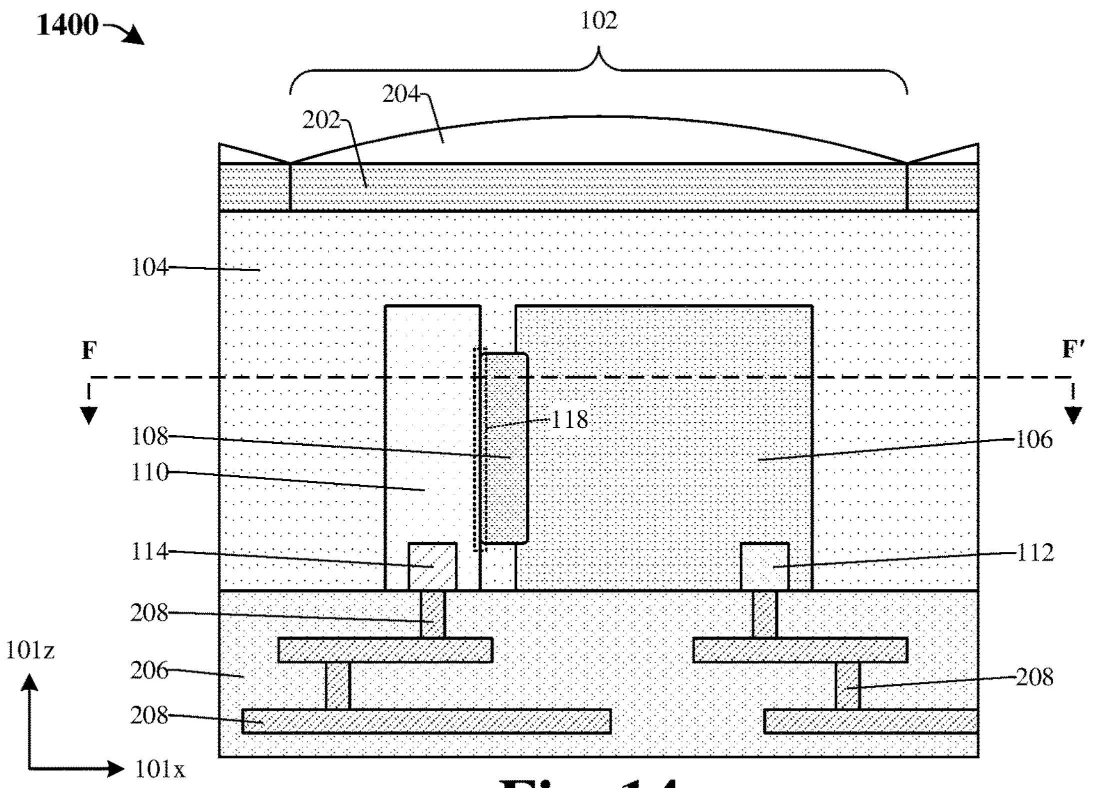
FIG. 14 illustrates a cross-sectional view of some embodiments of the image sensor of FIG. 2 in which the image sensor is devoid of the trench isolation structure.
Figure 15:
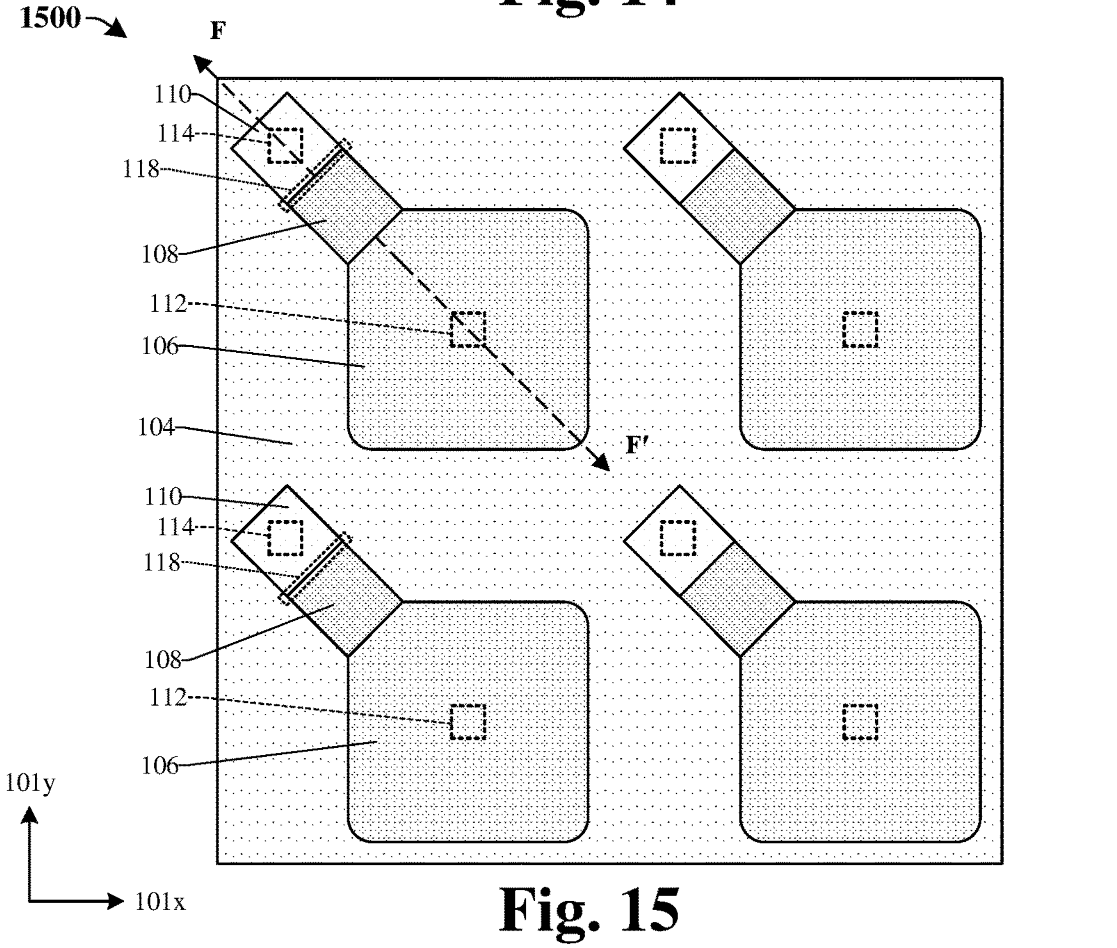
FIG. 15 illustrates a top view of some embodiments of the image sensor of FIG. 14.
Figure 16:
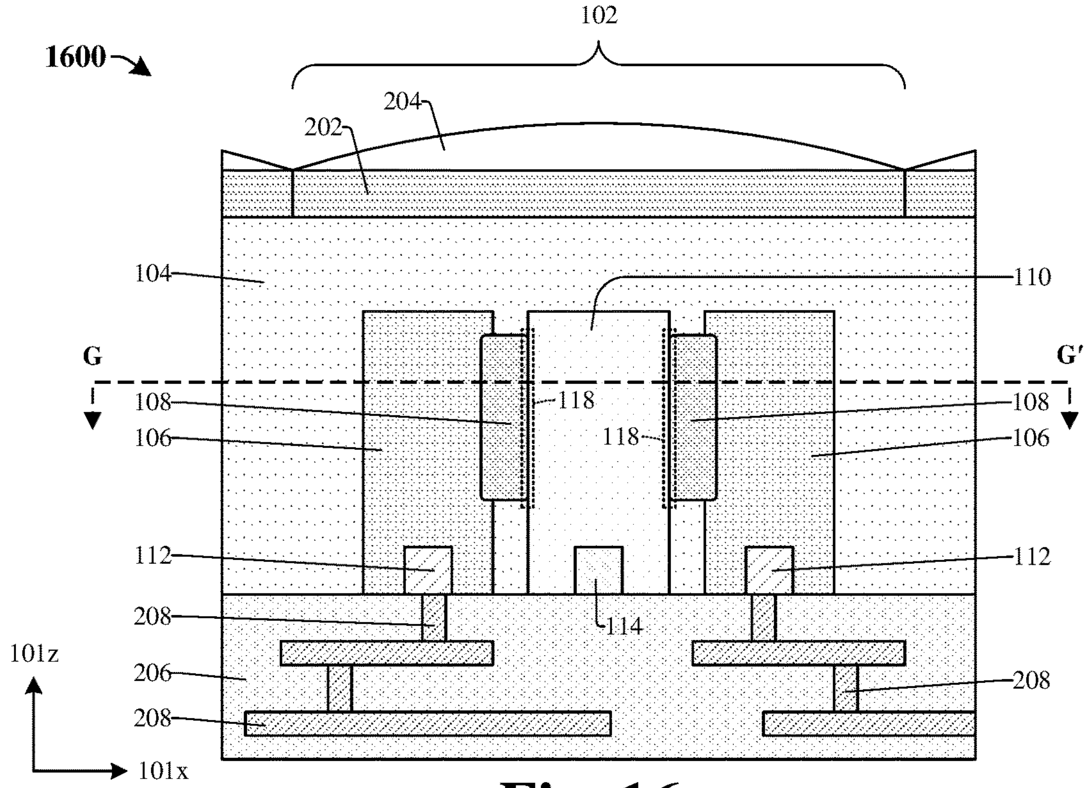
FIG. 16 illustrates a cross-sectional view of some embodiments of the image sensor of FIG. 8 in which the image sensor is devoid of the trench isolation structure.
Figure 17:
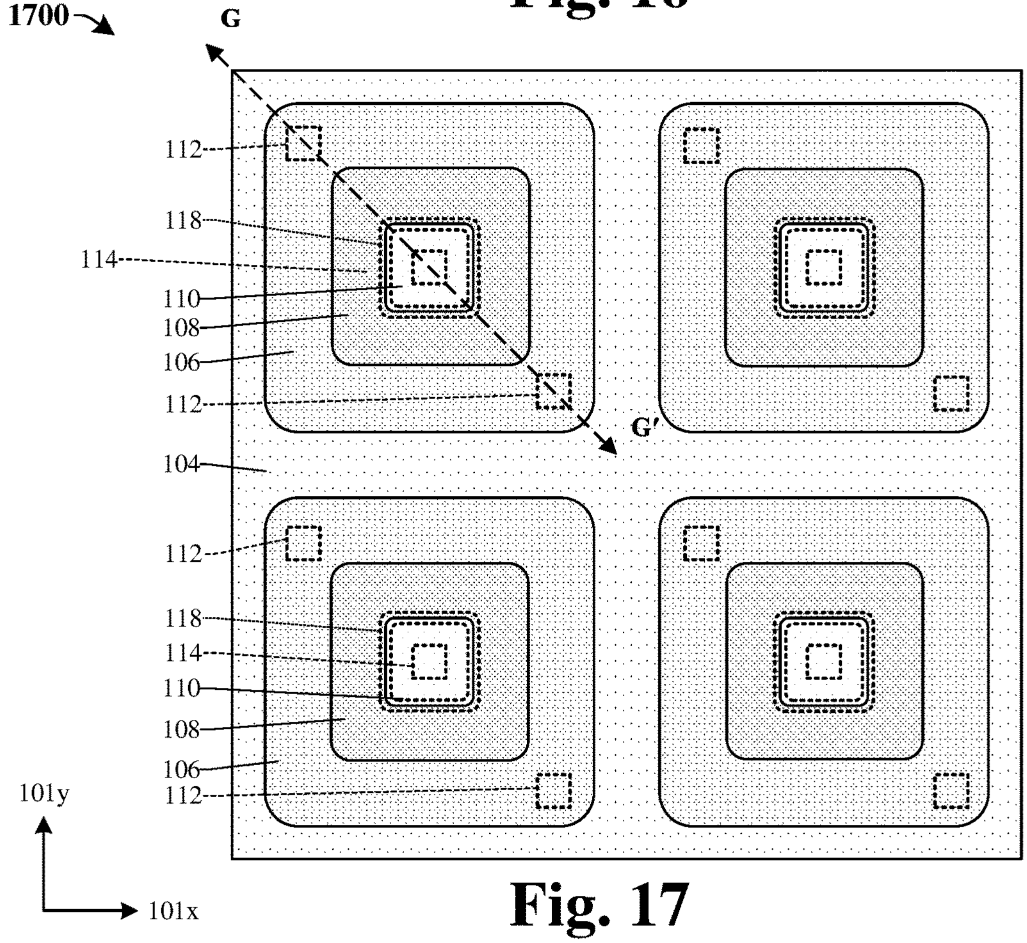
FIG. 17 illustrates a top view of some embodiments of the image sensor of FIG. 16.

FIG. 14 illustrates a cross-sectional view 1400 of some embodiments of the image sensor of FIG. 2 in which the image sensor is devoid of the trench isolation structure 116. FIG. 15 illustrates a top view 1500 of some embodiments of the image sensor of FIG. 14. In some embodiments, cross-sectional view 1400 of FIG. 14 may, for example, be taken across line F-F' of FIG. 15. FIG. 16 illustrates a cross-sectional view 1600 of some embodiments of the image sensor of FIG. 8 in which the image sensor is devoid of the trench isolation structure 116. FIG. 17 illustrates a top view 1700 of some embodiments of the image sensor of FIG. 16.

In some embodiments, cross-sectional view 1600 of FIG. 16 may, for example, be taken across line G-G' of FIG. 17.

For example, in some embodiments, the pixel 102 is not separated from neighboring pixels by the trench isolation structure 116. Instead, the first semiconductor layer 104 continuously extends between the pixel 102 and neighboring pixels. In some embodiments, the pixel 102 operates independently of the neighboring pixels and thus the trench isolation structure 116 may not be needed to isolate neighboring pixels. By removing the trench isolation structure 116 in such instances, a cost of forming the image sensor and/or a time required to form the image sensor may be reduced. Further, a size of the pixel 102 may be reduced.

FIGS. 18-26 illustrate cross-sectional views 1800-2600 of some embodiments of a method for forming an image sensor including a first semiconductor layer 104, a second semiconductor layer 106, a first doped region 108 in a first semiconductor layer 104 and laterally beside the second semiconductor layer 106, and a second doped region 110 in the first semiconductor layer and laterally beside the first doped region 108. Although FIGS. 18-26 are described in relation to a method, it will be appreciated that the structures disclosed in FIGS. 18-26 are not limited to such a method, but instead may stand alone as structures independent of the method.

Figure 18:
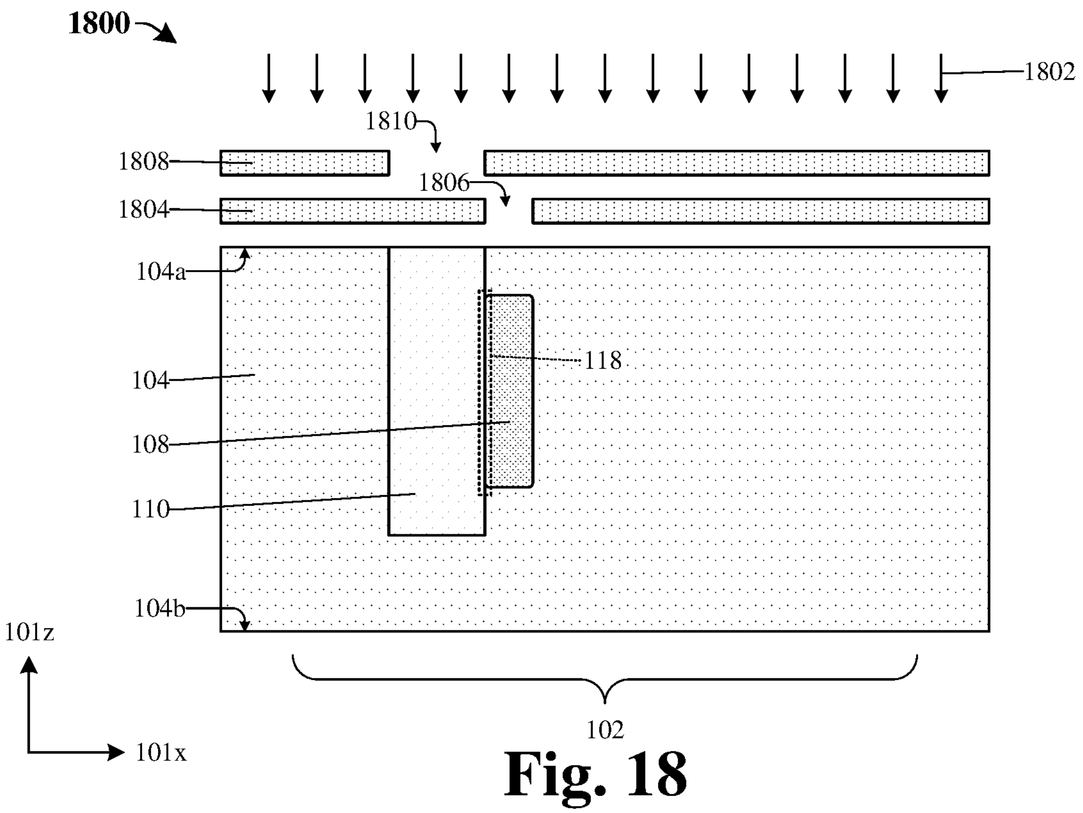
FIGS. 18-26 illustrate cross-sectional views of some embodiments of a method for forming an image sensor including a first semiconductor layer, a second semiconductor layer, a first doped region in a first semiconductor layer and laterally beside the second semiconductor layer, and a second doped region in the first semiconductor layer and laterally beside the first doped region.

As shown in cross-sectional view 1800 of FIG. 18, a first doped region 108 and a second doped region 110 are formed in the first semiconductor layer 104 within a perimeter of the pixel 102. In some embodiments, the first doped region 108 is formed in the first semiconductor layer 104 by doping the first semiconductor layer 104 with a first dopant (e.g., a p-type dopant such as, for example, boron, gallium, or some other suitable dopant) and the second doped region 110 is formed in the first semiconductor layer 104 by doping the first semiconductor layer 104 with a second dopant, different than the first dopant (e.g., an n-type dopant such as, for example, arsenic, phosphorous, or some other suitable dopant). In some embodiments, the first dopant and the second dopant are implanted in the first semiconductor layer 104 by one or more implantation processes (e.g., ion implantation processes or some other suitable implantation processes), as illustrated by arrows 1802. In some embodiments, one or more masking layers may be in place over the first semiconductor layer 104 during the implantation process(es). For example, a first masking layer 1804 having a first opening 1806 is on the first side 104*a* of the first semiconductor layer 104 during the implantation of the first dopant to form the first doped region 108 in the first semiconductor layer 104 directly below the first opening 1806. Further, a second masking layer 1808 having a second opening 1810 is on the first side 104*a* of the first semiconductor layer 104 during the implantation of the second dopant to form the second doped region 110 in the first semiconductor layer 104 directly below the second opening 1810.

In some embodiments, the first and second doped regions 108, 110 are formed in the first semiconductor layer 104 one at a time. In some embodiments, the deeper of the first and second doped regions 108, 110 is formed in the first semiconductor layer 104 before the shallower of the first and second doped regions 108, 110. For example, in some embodiments, the second doped region 110 is formed in the first semiconductor layer 104 and the first doped region 108 is subsequently formed in the first semiconductor layer 104 laterally beside the second doped region 110. In some other embodiments, the first doped region 108 may alternatively be formed in the first semiconductor layer 104 before the second doped region 110 is formed in the first semiconductor layer 104.

In some embodiments, the first doped region 108 is formed in the first semiconductor layer 104 below the first side 104*a* of the first semiconductor layer 104 and extends vertically towards the second side 104*b* of the first semiconductor layer 104. Thus, in some embodiments, the first doped region 108 may be referred to as a buried doped region. In some embodiments, the second doped region 110 is formed along the first side 104*a* of the first semiconductor layer 104 and extends vertically towards the second side 104*b* of the first semiconductor layer 104.

Forming the first and second doped regions 108, 110 laterally beside one another in the first semiconductor layer 104 forms a p-n junction 118 along the interface between the first and second doped regions 108, 110. For example, by forming the first doped region 108 laterally beside the second doped region 110 so that a side of the first doped region 108 extends along a side of the second doped region 110, the p-n junction 118 at which the first doped region 108 and the second doped region 110 meet extends in a vertical direction (e.g., vertical direction 101*z*). Thus, a width of the pixel 102 can be reduced without reducing a size of the p-n junction 118. As a result, a lateral distance between the pixel 102 and neighboring pixels can be reduced without reducing a performance of the image sensor.

In some embodiments, a height (e.g., along a vertical direction 101*z*) of the p-n junction 118 can be controlled by controlling the depths of the first doped region 108 and the second doped region 110. Thus, when a width of the pixel 102 is reduced, a height of the p-n junction 118 can be increased to maintain the total size of the p-n junction 118. As a result, a performance of the image sensor can be improved.

Figure 19:
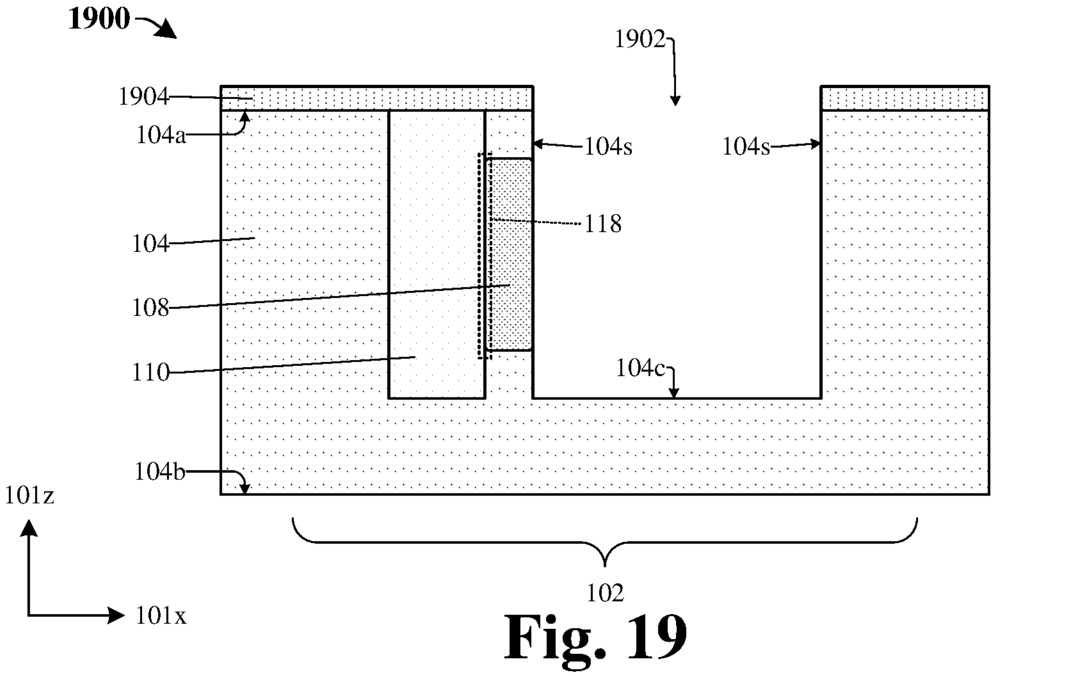

As shown in cross-sectional view 1900 of FIG. 19, the first semiconductor layer 104 is patterned to form a trench 1902 in the first semiconductor layer 104 beside the first doped region 108. In some embodiments, the patterning comprises forming a masking layer 1904 over the first semiconductor layer 104 (e.g., on the first side 104*a* of the first semiconductor layer 104) and etching the first semiconductor layer 104 according to the masking layer 1904 to form the trench 1902. The trench 1902 is delimited by sidewalls 104*s* and a lower surface 104*c* of the first semiconductor layer 104. In some embodiments, the etching includes a dry etching process (e.g., a plasma etching process, a reactive ion etching process, an ion beam etching process, or the like) or some other suitable etching process. In some embodiments, the masking layer 1904 may, for example, comprise photoresist, a hard mask, or some other suitable material. In some embodiments, the masking layer 1904 is removed during and/or after the etching.

Figure 20:
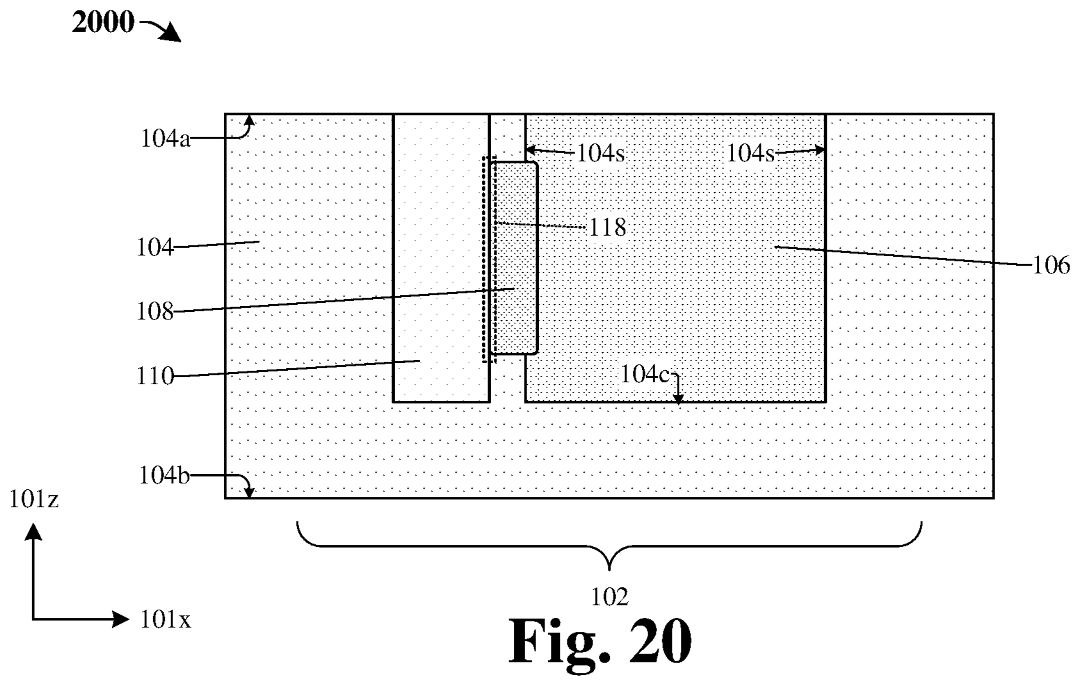

As shown in cross-sectional view 2000 of FIG. 20, a second semiconductor layer 106 is formed in the trench 1902. For example, the second semiconductor layer 106 is formed between the sidewalls 104*s* and on the lower surface 104*c* of the first semiconductor layer 104 that delimit the trench 1902. In some embodiments, the second semiconductor layer 106 comprises germanium, some group III-V semiconductor (e.g., gallium arsenide, gallium nitride, or the like), or some other suitable material and is formed in the trench 1902 by way of an epitaxial growth process. In some other embodiments, the second semiconductor layer 106 may be deposited in the trench 1902 by an chemical vapor deposition (CVD), a physical vapor deposition (PVD), an atomic layer deposition (ALD) process, or some other suitable process. The second semiconductor layer 106 has the first doping type (e.g., p-type). In some embodiments, the first doped region 108 may diffuse into the second semiconductor layer 106 after the second semiconductor layer 106 is formed along the first doped region 108.

Figure 21:
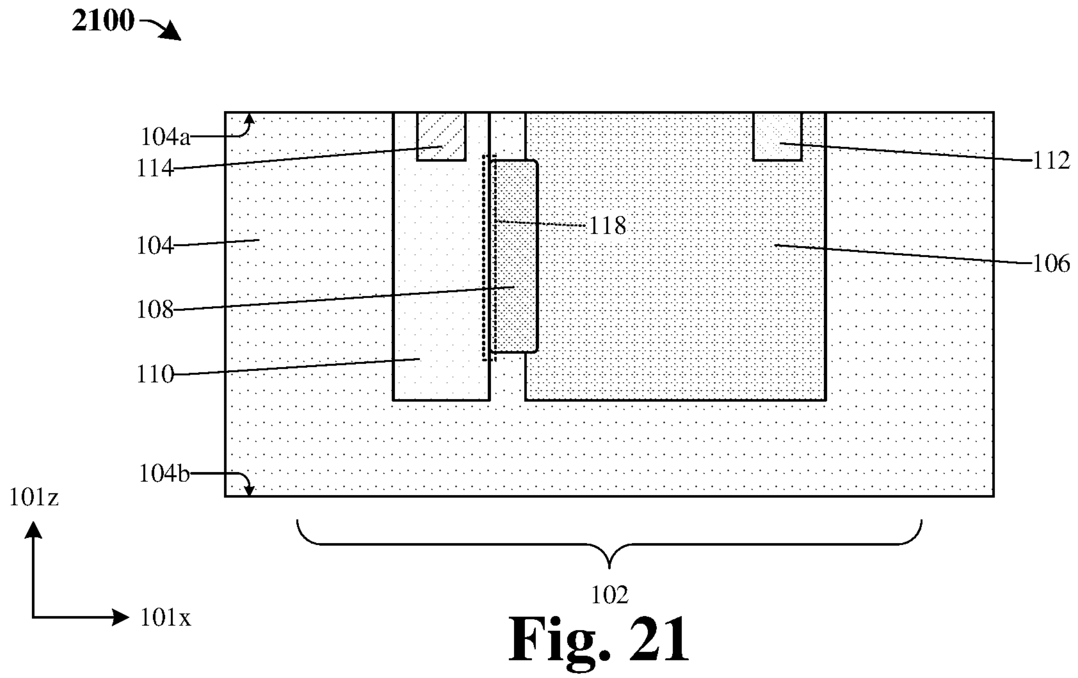

As shown in cross-sectional view 2100 of FIG. 21, a first contact region 112 is formed in the second semiconductor layer 106 and a second contact region 114 is formed in the second doped region 110. In some embodiments, the first contact region 112 is formed in the second semiconductor layer 106 by doping the second semiconductor layer 106 with a dopant having the first doping type (e.g., a p-type dopant) by way of an implantation process or some other suitable process. In some embodiments, a masking layer (not shown) having an opening over the second semiconductor layer 106 may be in place during the implantation process. In some embodiments, the second contact region 114 is formed in the second doped region 110 by doping the second doped region 110 with a dopant having the second doping type (e.g., an n-type dopant) by way of an implantation process or some other suitable process. In some embodiments, a masking layer (not shown) having an opening over the second doped region 110 may be in place during the implantation process.

Figure 22:
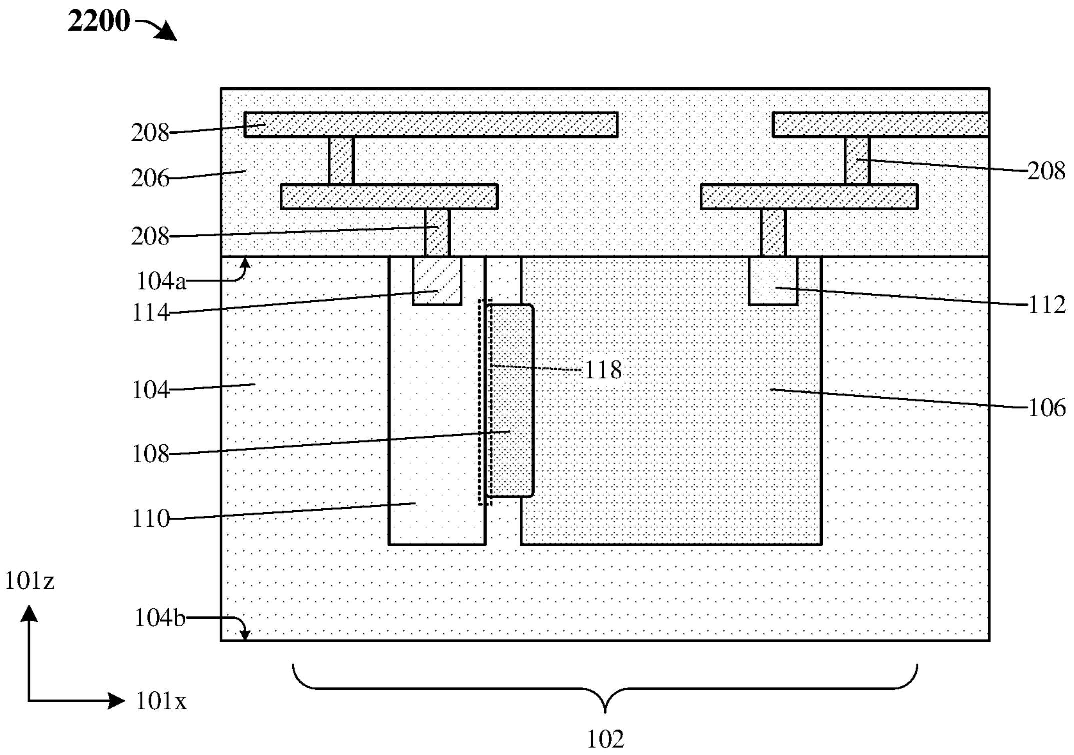

As shown in cross-sectional view 2200 of FIG. 22, a dielectric structure 206 is formed over the first side of the first semiconductor layer 104 and a plurality of conductive interconnects 208 are formed within the dielectric structure 206. Some of the conductive interconnects 208 are formed on the first and second contact regions 112, 114. In some embodiments, the dielectric structure 206 comprises a plurality of dielectric layers. In some embodiments, the dielectric layers may comprise silicon dioxide, silicon nitride, or some other suitable material(s) and may be deposited by a CVD process, a PVD process, an ALD process, or some other suitable process. In some embodiments, the conductive interconnects 208 are formed within the dielectric layers by patterning the dielectric layers and depositing conductive materials (e.g., copper, tungsten, aluminum, or some other suitable material) over the patterned dielectric layers by a CVD process, a PVD process, an ALD process, or some other suitable process.

Figure 23:
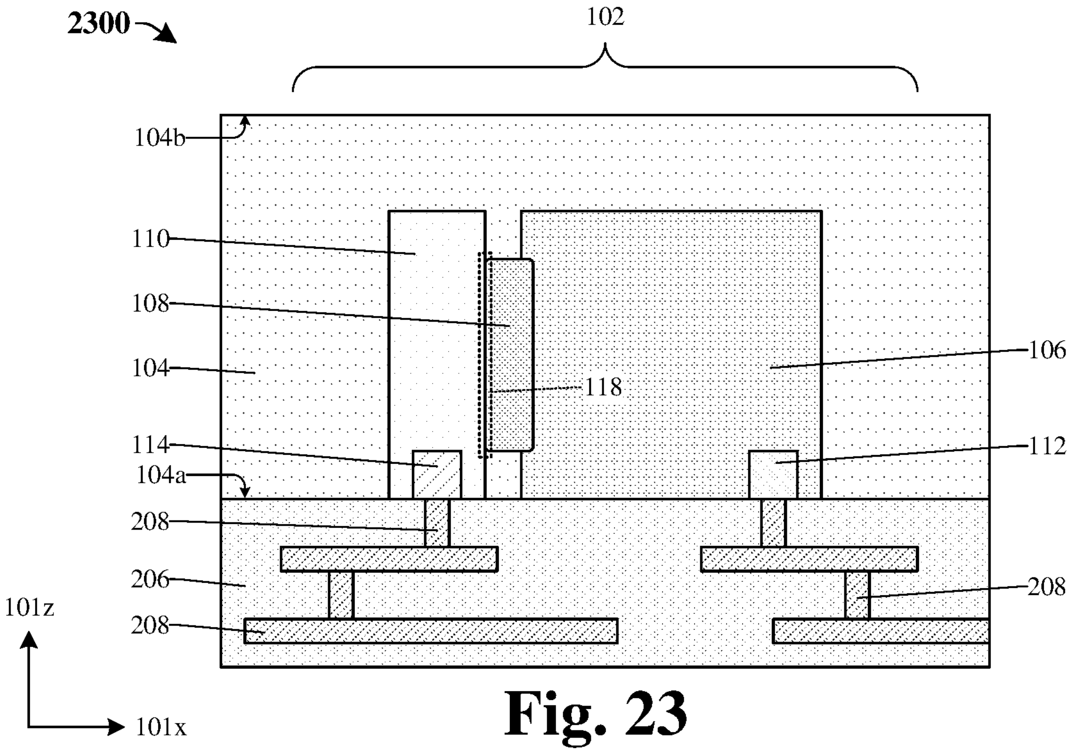

As shown in cross-sectional view 2300 of FIG. 23, the image sensor is inverted such that the second side **104*b* of the first semiconductor layer 104 is over the first side 104*a* of the first semiconductor layer 104**.

Figure 24:
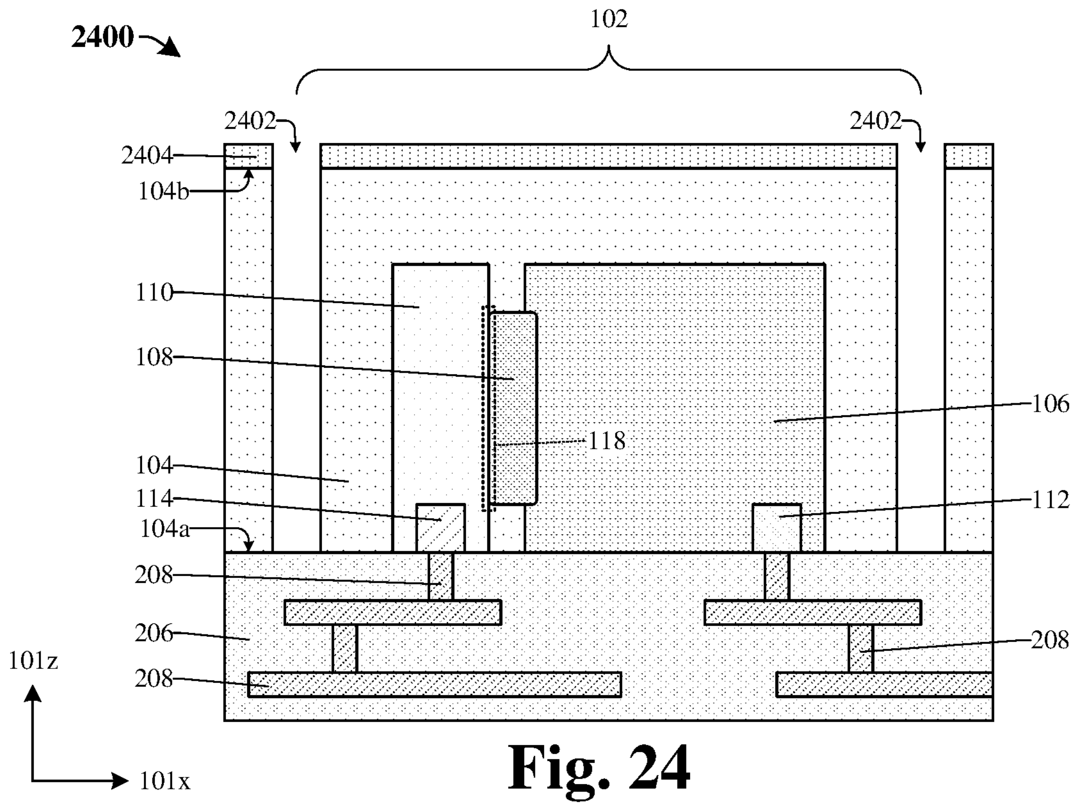

As shown in cross-sectional view 2400 of FIG. 24, the first semiconductor layer 104 is patterned to form an isolation trench 2402 in the first semiconductor layer 104. The isolation trench 2402 surrounds the pixel 102 around a perimeter of the pixel 102. In some embodiments, the patterning comprises forming a masking layer 2404 over the first semiconductor layer 104 (e.g., on the second side of the first semiconductor layer) and etching the first semiconductor layer 104 according to the masking layer 2404 to form the isolation trench 2402. In some embodiments, the etching includes a dry etching process or some other suitable etching process. In some embodiments, the masking layer 2404 may, for example, comprise photoresist, a hard mask, or some other suitable material.

Figure 25:
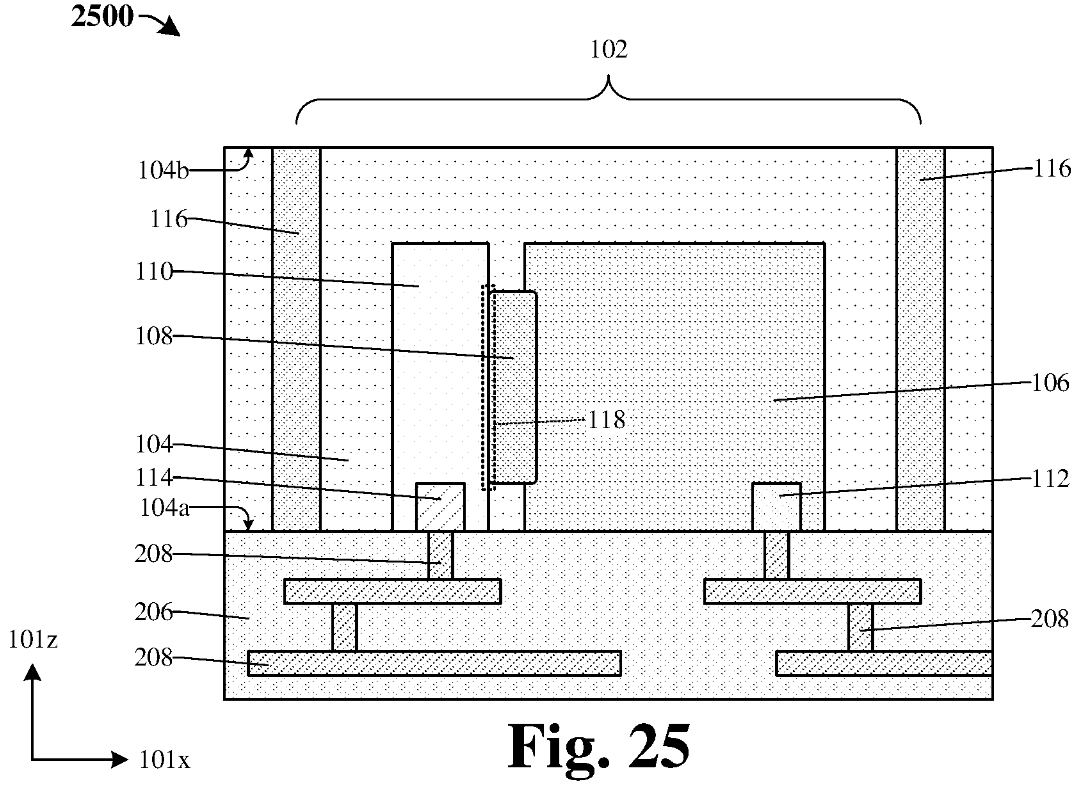

As shown in cross-sectional view 2500 of FIG. 25, an trench isolation structure 116 is formed in the isolation trench 2402. In some embodiments, the trench isolation structure 116 is formed by depositing an isolation material (e.g., aluminum, aluminum oxide, silicon dioxide, silicon nitride, titanium, titanium nitride, copper, or some other suitable material) in the isolation trench by a CVD process, a PVD process, an ALD process, or some other suitable process. In some embodiments, a planarization process (e.g., a chemical mechanical planarization (CMP) process or the like) may be performed on the isolation material and the first semiconductor layer 104 after the isolation material is deposited in the isolation trench 2402.

Figure 26:
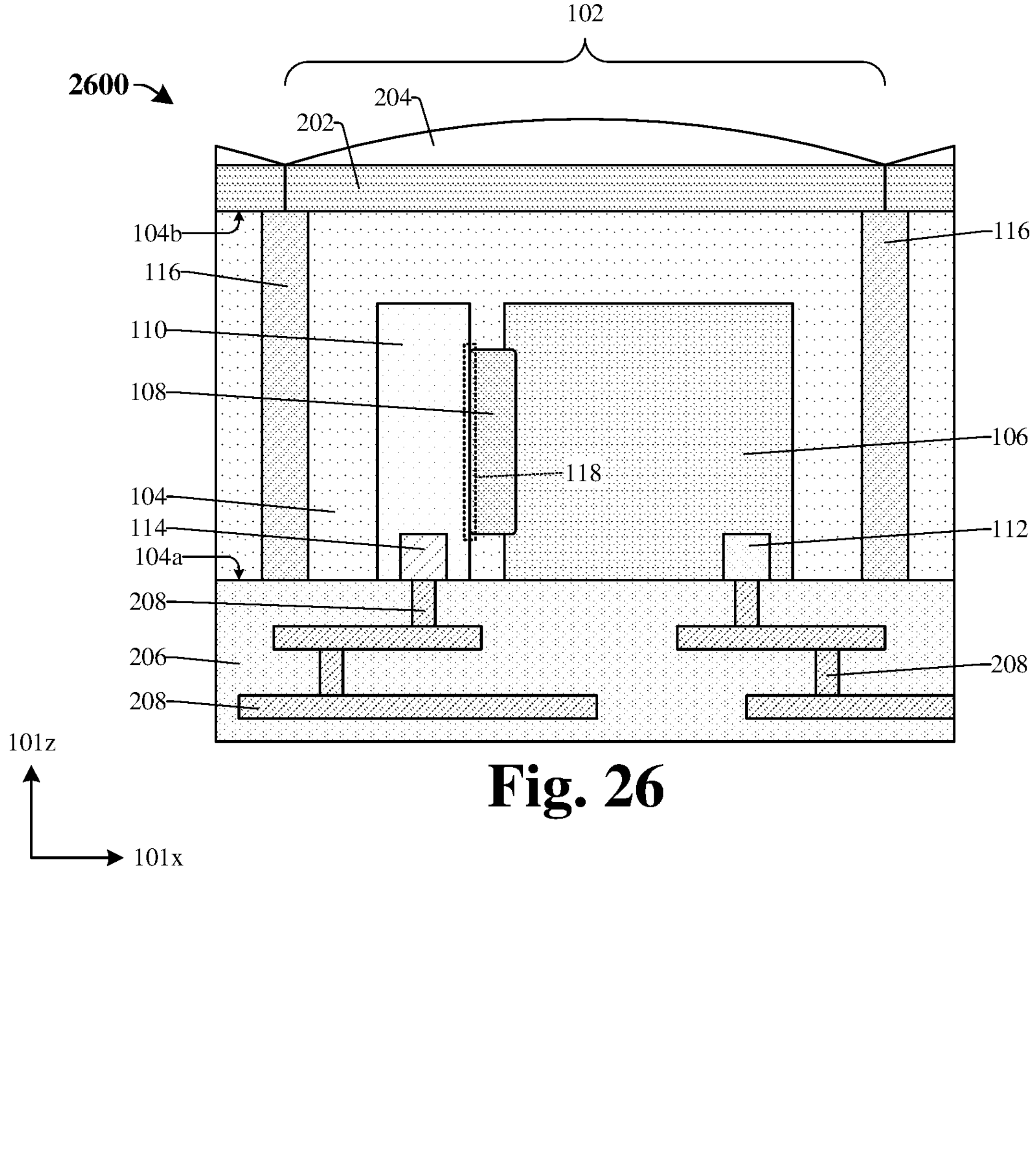

As shown in cross-sectional view 2600 of FIG. 26, a color filter 202 is formed over the first semiconductor layer (e.g., on the second side of the first semiconductor layer) and a micro-lens 204 is formed over the color filter 202.

Figure 27:
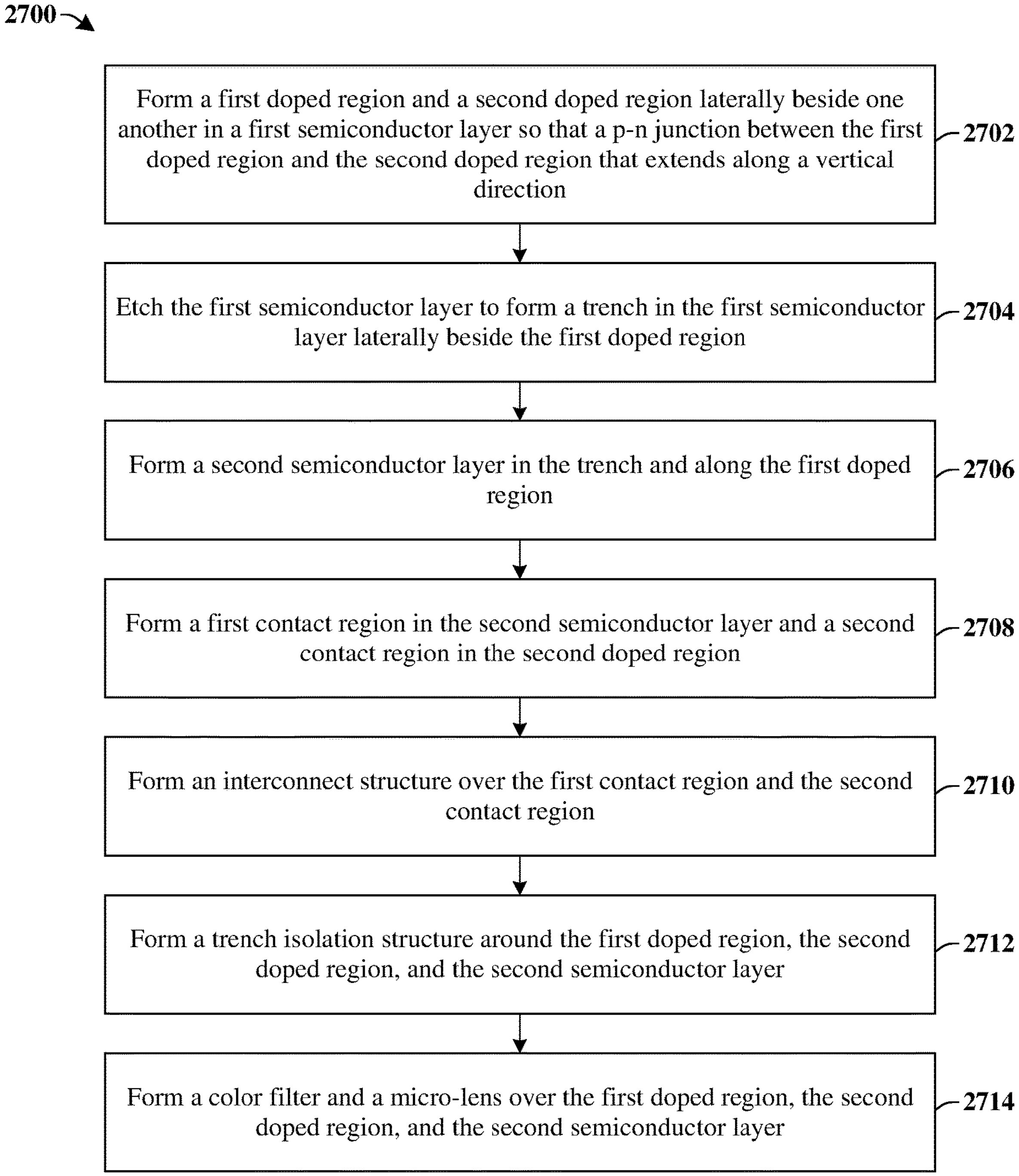
FIG. 27 illustrates a flow diagram of some embodiments of a method for forming an image sensor including a first semiconductor layer, a second semiconductor layer, a first doped region in a first semiconductor layer and laterally beside the second semiconductor layer, and a second doped region in the first semiconductor layer and laterally beside the first doped region.

FIG. 27 illustrates a flow diagram of some embodiments of a method 2700 for forming an image sensor including a first semiconductor layer, a second semiconductor layer, a first doped region in a first semiconductor layer and laterally beside the second semiconductor layer, and a second doped region in the first semiconductor layer and laterally beside the first doped region. While method 2700 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At block 2702, form a first doped region and a second doped region laterally beside one another in a first semiconductor layer so that a p-n junction between the first doped region and the second doped region that extends along a vertical direction. FIG. 18 illustrates a cross-sectional view 1800 of some embodiments corresponding to block 2702.

At block 2704, etch the first semiconductor layer to form a trench in the first semiconductor layer laterally beside the first doped region. FIG. 19 illustrates a cross-sectional view 1900 of some embodiments corresponding to block 2704.

At block 2706, form a second semiconductor layer in the trench and along the first doped region. FIG. 20 illustrates a cross-sectional view 2000 of some embodiments corresponding to block 2706.

At block 2708, form a first contact region in the second semiconductor layer and a second contact region in the second doped region. FIG. 21 illustrates a cross-sectional view 2100 of some embodiments corresponding to block 2708.

At block 2710, form an interconnect structure over the first contact region and the second contact region. FIG. 22 illustrates a cross-sectional view 2200 of some embodiments corresponding to block 2710.

At block 2712, form a trench isolation structure around the first doped region, the second doped region, and the second semiconductor layer. FIG. 25 illustrates a cross-sectional view 2500 of some embodiments corresponding to block 2712.

At block 2714, form a color filter and a micro-lens over the first doped region, the second doped region, and the second semiconductor layer. FIG. 26 illustrates a cross-sectional view 2600 of some embodiments corresponding to block 2714.

Thus, the present disclosure relates to an image sensor including a first doped region and a second doped region laterally beside the first doped region so that a p-n junction between the doped regions extends in a vertical direction along the first and second doped regions.

Accordingly, in some embodiments, the present disclosure relates to an image sensor including a first semiconductor layer having a bottom side and a top side. The first semiconductor layer has a first doping type. A second semiconductor layer is between sidewalls of the first semiconductor layer and extends vertically along the sidewalls of the first semiconductor layer from the bottom side of the first semiconductor layer toward the top side of the first semiconductor layer. The second semiconductor layer has the first doping type. A first doped region is in the first semiconductor layer and laterally beside the second semiconductor layer. The first doped region extends vertically along a sidewall of the second semiconductor layer. The first doped region has the first doping type. A second doped region is in the first semiconductor layer and laterally beside the first doped region. The second doped region has a second doping type, different from the first doping type. The second doped region extends vertically along a side of the first doped region and forms a p-n junction with the first doped region.

In other embodiments, the present disclosure relates to an image sensor including a first semiconductor layer having a bottom side in a first plane and a top side in a second plane. The first semiconductor layer has a first doping type. A first doped region is in the first semiconductor layer and extends vertically along a first sidewall of the first semiconductor layer. The first doped region has the first doping type. A second semiconductor layer extends vertically along a first side of the first doped region from the bottom side of the first semiconductor layer toward the top side of the first semiconductor layer. The second semiconductor layer is between the first sidewall of the first semiconductor layer and a second sidewall of the first semiconductor layer. The second semiconductor layer has the first doping type. A second doped region is in the first semiconductor layer and extends vertically along a second side of the first doped region from the bottom side of the first semiconductor layer toward the top side of the first semiconductor layer. The second doped region has a second doping type, different from the first doping type. The second doped region and the first doped region meet at a p-n junction, wherein the p-n junction extends vertically along the second side of the first doped region and along a side of the second doped region, and wherein the p-n junction is in a third plane that intersects the first plane and the second plane.

In yet other embodiments, the present disclosure relates to a method for forming an image sensor. The method includes doping a first semiconductor layer having a first doping type with a first dopant to form a first doped region having the first doping type in the first semiconductor layer. The first semiconductor layer is doped with a second dopant to form a second doped region having a second doping type, different than the first doping type, in the first semiconductor layer. The first doped region and the second doped region are formed laterally beside one another in the first semiconductor layer. A first side of the first doped region extends vertically along a side of the second doped region at a p-n junction between the first doped region and the second doped region. The first semiconductor layer is etched to form a trench in the first semiconductor layer laterally beside the first doped region. A sidewall of the first semiconductor layer that delimits the trench extends vertically along a second side of the first doped region, opposite the first side. A second semiconductor layer having the first doping type is formed in the trench and along the second side of the first doped region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an image sensor, the method comprising:

doping a first semiconductor layer having a first doping type with a first dopant to form a first doped region having the first doping type in the first semiconductor layer;

doping the first semiconductor layer with a second dopant to form a second doped region having a second doping type, different than the first doping type, in the first semiconductor layer, wherein the first doped region and the second doped region are formed laterally beside one another in the first semiconductor layer, and wherein a first side of the first doped region extends vertically along a side of the second doped region at a p-n junction between the first doped region and the second doped region;

etching the first semiconductor layer to form a trench in the first semiconductor layer laterally beside the first doped region, wherein a sidewall of the first semiconductor layer that delimits the trench extends vertically along a second side of the first doped region, opposite the first side; and forming a second semiconductor layer having the first doping type in the trench and along the second side of the first doped region.

2. The method of claim 1, wherein forming the second semiconductor layer comprises performing an epitaxy process in the trench to fill the trench with the second semiconductor layer, and wherein the second semiconductor layer comprises a different semiconductor material than the first semiconductor layer.

3. The method of claim 1, further comprising:

forming a trench isolation structure in the first semiconductor layer and laterally surrounding the p-n junction, wherein the trench isolation structure extends vertically between a bottom side of the first semiconductor layer and a top side of the first semiconductor layer, and wherein the trench isolation structure is laterally spaced from the first doped region, the second doped region, and the second semiconductor layer.

4. The method of claim 1, further comprising:

forming a first contact region in the second semiconductor layer along a bottom side of the second semiconductor layer and extending vertically toward a top side of the second semiconductor layer;

forming a first conductive interconnect contacting the second semiconductor layer at the first contact region;

forming a second contact region in the second doped region along the bottom side of the first semiconductor layer and extending vertically toward the top side of the first semiconductor layer; and forming a second conductive interconnect contacting the first semiconductor layer at the second contact region.

5. The method of claim 2, wherein etching the first semiconductor layer to form the trench exposes the second side of the first doped region, wherein the second semiconductor layer is formed on the sidewall of the first semiconductor layer that delimits the trench and on the second side of the first doped region of the first semiconductor layer by the epitaxy process.

6. A method of forming an image sensor, the method comprising:

providing a first semiconductor layer comprising a first semiconductor, the first semiconductor layer having a bottom side in a first plane and a top side in a second plane, the first semiconductor layer having a first doping type;

forming a first doped region and a second doped region in the first semiconductor layer, the first doped region extending vertically along a first sidewall of the first semiconductor layer, the first doped region having the first doping type, the second doped region extending vertically along a first side of the first doped region from the bottom side of the first semiconductor layer toward the top side of the first semiconductor layer, the second doped region having a second doping type different than the first doping type;

forming a second semiconductor layer comprising a second semiconductor, different than the first semiconductor, between the first sidewall of the first semiconductor layer and a second sidewall of the first semiconductor layer, the second semiconductor layer coupled to the first doped region of the first semiconductor layer and extending vertically along a second side of the first doped region of the first semiconductor layer from the bottom side of the first semiconductor layer toward the top side of the first semiconductor layer, the second semiconductor layer having the first doping type;

forming a first conductive interconnect contacting the second semiconductor layer; and forming a second conductive interconnect contacting the first semiconductor layer at the second doped region of the first semiconductor layer, wherein the second doped region of the first semiconductor layer and the first doped region of the first semiconductor layer meet at a p-n junction, wherein the p-n junction extends vertically along the first side of the first doped region of the first semiconductor layer and along a side of the second doped region of the first semiconductor layer, and wherein the p-n junction is in a third plane that intersects the first plane and the second plane.

7. The method of claim 6, wherein the first doped region of the first semiconductor layer is laterally between the second doped region of the first semiconductor layer and the second semiconductor layer.

8. The method of claim 6, wherein the third plane is approximately perpendicular to the first plane and the second plane.

9. The method of claim 6, wherein a bottom side of the second semiconductor layer is in the first plane.

10. The method of claim 7, wherein the first semiconductor comprises silicon and the second semiconductor comprises germanium, gallium, or indium.

11. A method of forming an image sensor, the method comprising:

providing a first semiconductor layer comprising a first semiconductor, a bulk region of the first semiconductor layer having a first doping type;

forming a first doped region and a second doped region in the bulk region of the first semiconductor layer, the first doped region having the first doping type, the second doped region having a second doping type different than the first doping type, the second doped region laterally beside the first doped region, extending vertically along a side of the first doped region, and forming a p-n junction with the first doped region, the bulk region of the first semiconductor layer surrounding the first and second doped regions of the first semiconductor layer;

etching the first semiconductor layer to form a trench in the first semiconductor layer, the trench delimited by sidewalls of the first semiconductor layer; and filling the trench with a second semiconductor layer comprising a second semiconductor, different than the first semiconductor, and having the first doping type, the second semiconductor layer extending laterally between the sidewalls of the first semiconductor layer and extending vertically along the sidewalls of the first semiconductor layer from a bottom side of the first semiconductor layer toward a top side of the first semiconductor layer, wherein the second semiconductor layer is laterally beside and coupled to the first doped region of the first semiconductor layer, and wherein a sidewall of the second semiconductor layer extends vertically along a side of the first doped region of the first semiconductor layer.

12. The method of claim 11, wherein the first doped region of the first semiconductor layer is directly between the second doped region of the first semiconductor layer and the second semiconductor layer.

13. The method of claim 11, wherein the second doped region of the first semiconductor layer is laterally separated from the second semiconductor layer by the first doped region of the first semiconductor layer and the bulk region of the first semiconductor layer.

14. The method of claim 11, wherein the bottom side and the top side of the first semiconductor layer extend along a horizontal direction, and wherein the p-n junction extends along a vertical direction transverse to the horizontal direction.

15. The method of claim 11, wherein the bulk region of the first semiconductor layer extends along a top of the first doped region of the first semiconductor layer, along a top of the second doped region of the first semiconductor layer, and along an upper surface of the second semiconductor layer.

16. The method of claim 11, wherein the bulk region of the first semiconductor layer extends along a top of the first doped region of the first semiconductor layer and is directly between the second doped region of the first semiconductor layer and the second semiconductor layer.

17. The method of claim 11, wherein the bulk region of the first semiconductor layer extends along a bottom of the first doped region of the first semiconductor layer and is directly between the second doped region of the first semiconductor layer and the second semiconductor layer.

18. The method of claim 11, wherein a width of the second semiconductor layer along a lateral direction is greater than a width of the first doped region of the first semiconductor layer along the lateral direction and greater than a width of the second doped region of the first semiconductor layer along the lateral direction.

19. The method of claim 11, further comprising:

forming a trench isolation structure laterally surrounding the p-n junction and extending vertically between the bottom side and the top side of the first semiconductor layer, wherein the second doped region of the first semiconductor layer is laterally spaced from the trench isolation structure and laterally between the trench isolation structure and the first doped region of the first semiconductor layer, and wherein the first doped region of the first semiconductor layer is laterally between the trench isolation structure and the second semiconductor layer.

20. The method of claim 11, wherein the first doped region of the first semiconductor layer is ring shaped and laterally surrounds the second semiconductor layer in a first closed path, and wherein the second doped region of the first semiconductor layer is ring shaped and laterally surrounds the first doped region in a second closed path.

* * * * *